(12) United States Patent
Kandori et al.

(10) Patent No.: US 8,339,014 B2
(45) Date of Patent: Dec. 25, 2012

(54) OSCILLATOR DEVICE

(75) Inventors: Atsushi Kandori, Ebina (JP); Chienliu Chang, Kawasaki (JP); Makoto Takagi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 391 days.

(21) Appl. No.: 12/599,688

(22) PCT Filed: Jun. 30, 2008

(86) PCT No.: PCT/JP2008/062244
§ 371 (c)(1),
(2), (4) Date: Nov. 10, 2009

(87) PCT Pub. No.: WO2009/005160
PCT Pub. Date: Jan. 8, 2009

(65) Prior Publication Data
US 2010/0213791 A1    Aug. 26, 2010

(30) Foreign Application Priority Data
Jul. 4, 2007   (JP) .................................. 2007-176300

(51) Int. Cl.
*G02B 26/08* (2006.01)
(52) U.S. Cl. ........................................................ 310/309
(58) Field of Classification Search .................. 310/300, 310/309, 15, 17, 36; 73/504.2–504.15; 359/200.6, 359/224.1, 290, 291, 292, 295, 298
See application file for complete search history.

(56) References Cited

U.S. PATENT DOCUMENTS

| | | | |
|---|---|---|---|
| 6,164,134 A * | 12/2000 | Cargille | 73/504.02 |
| 6,758,983 B2 | 7/2004 | Conant et al. | |
| 7,026,184 B2 | 4/2006 | Xie et al. | |
| 7,085,122 B2 | 8/2006 | Wu et al. | |
| 7,149,442 B2 | 12/2006 | Ushijima et al. | |
| 7,382,137 B2 | 6/2008 | Ushijima et al. | |
| 2003/0227538 A1 * | 12/2003 | Fujii et al. | 347/260 |
| 2004/0263937 A1 * | 12/2004 | Fujii et al. | 359/212 |
| 2005/0231793 A1 * | 10/2005 | Sato | 359/291 |
| 2006/0132883 A1 * | 6/2006 | Saitoh | 359/224 |
| 2008/0218172 A1 | 9/2008 | Ushijima et al. | |
| 2008/0264167 A1 | 10/2008 | Kandori et al. | |
| 2009/0193893 A1 | 8/2009 | Kandori et al. | |
| 2009/0205423 A1 | 8/2009 | Takagi et al. | |

FOREIGN PATENT DOCUMENTS

| | | |
|---|---|---|
| JP | 2004-354108 A | 12/2004 |
| JP | 2006-154315 A | 6/2006 |
| JP | 2006-162495 A | 6/2006 |
| WO | 03/010545 A1 | 2/2003 |

OTHER PUBLICATIONS

Taiwanese Office Action dated Sep. 19, 2011 in corresponding Taiwanese Application No. 097125115.

* cited by examiner

*Primary Examiner* — Tran Nguyen
(74) *Attorney, Agent, or Firm* — Fitzpatrick, Cella, Haper & Scinto

(57) ABSTRACT

An oscillator device that includes a movable body oscillatably supported about a rotation axis, wherein the movable body is separated into plural electrically separated conductive regions in the thickness direction, and at least one of the plural electrically separated conductive regions in the thickness direction further has plural electrically separated conductive regions.

8 Claims, 22 Drawing Sheets

OSCILLATOR DEVICE

This application is a National Stage application under 35 U.S.C. §371 of International Application No. PCT/JP2008/062244 filed on Jun. 30, 2008, which claims priority to Japanese Application No. 2007-176300, filed on Jul. 4, 2007, the contents of each of the foregoing applications being incorporated by reference herein.

TECHNICAL FIELD

The present invention relates to an oscillator device, such as a microstructure, having plural conductive regions that are electrically insulated from one another. The oscillator device is applicable to an actuator, various sensors, optical deflector, or the like.

BACKGROUND ART

Various actuators have conventionally been proposed in which a movable body is oscillated by means of an electrostatic force generated by an electrostatic comb element. These actuators are manufactured by using a silicon substrate or the like with a micro electro mechanical system (MEMS) technique to which a semiconductor process is applied. A rotary actuator can be taken as an actuator used for optical scanning or the like.

As the rotary actuator described above, a technique has been proposed in which an oscillator device having regions electrically separated vertically in the thickness direction is formed by utilizing a silicon on insulator (SOI) substrate. Specifically, there has been proposed the one having the structure in which an electrostatic movable comb element mounted to a movable body and an electrostatic stationary comb element mounted to a support portion are electrically separated vertically in the thickness direction of the substrate (see Japanese Patent Application Laid-Open No. 2006-154315).

The rotary actuator disclosed in Japanese Patent Application Laid-Open No. 2006-154315 is manufactured by using an SOI substrate obtained by laminating plural silicon layers through an insulating film. Therefore, the oscillating movable body can be electrically separated vertically by the insulating layer in the thickness direction of the substrate. With this structure, an upward force and a downward force are respectively applied in the thickness direction of the substrate by exerting the electrostatic force on both ends of the movable body, so that the movable body can be rotated about a certain shaft. As described above, a rotation toward the outside of the plane of the substrate can be produced by using this structure in the movable body formed by the substrate.

The actuator having the structure disclosed in Japanese Patent Application Laid-Open No. 2006-154315 produces force in the rotating direction by the electrostatic force. On the other hand, some electrostatic forces are also produced in the direction of suppressing the rotation at that time. This is because the movable body includes electrically separated plural regions, on which the electrostatic forces are exerted in different directions with respect to the rotating direction depending upon the regions. When a highly efficient driving is performed, it is demanded that the electrostatic force that suppresses the rotation is reduced.

DISCLOSURE OF THE INVENTION

In view of the foregoing circumstance, the oscillator device according to the present invention includes a movable body that is oscillatably supported about a rotation axis. The movable body is electrically separated into plural conductive regions in the thickness direction, wherein at least one of the plural conductive regions electrically separated in the thickness direction further has plural electrically separated conductive regions.

The oscillator device described above can be used as devices described below. The oscillator device is applicable to an actuator including a potential application portion that converts input electric energy into physical motion so as to apply a potential to the conductive region for oscillating the movable body about the rotation axis. Further, the oscillator device according to the present invention is applicable to an actuator including a potential application portion that applies a potential to the conductive region for oscillating the movable body about the rotation axis and a detection portion that detects the magnitude of an induced charge induced to the conductive region for detecting the rotation condition of the movable body about the rotation axis.

Moreover, the oscillator device according to the present invention is applicable to a sensor including a detection portion that applies a potential to the conductive region so as not to cause the movable body to rotate about the rotation axis due to external force and that detects the external force on the basis of the applied potential. Further, the oscillator device according to the present invention is applicable to a gyrosensor including a potential application portion that applies a potential to the conductive region so as to cause the movable body to execute a reference oscillation about the rotation axis, and a detection portion that detects the rotation condition of the movable body about another rotation axis that is orthogonal to the rotation axis.

According to the present invention, the movable body has plural conductive regions that are electrically separated finely, whereby the electrostatic force that suppresses the rotation is further reduced to realize an oscillator device, such as an actuator, having an excellent driving efficiency.

Further features of the present invention will become apparent from the following description of exemplary embodiments with reference to the attached drawings.

BEST MODE FOR CARRYING OUT THE INVENTION

In the present invention, a movable body oscillatably supported about a rotation axis is electrically separated into plural regions in the thickness direction, wherein at least one of the electrically separated plural regions further includes plural electrically separated regions. For example, a movable body of a microstructure has three or four or more electrically insulated regions. Specifically, for example, it includes two conductive regions electrically separated vertically in the thickness direction of the substrate, and these regions are electrically separated in the direction of crossing the rotation axis of the microstructure (e.g., in the direction perpendicular to the thickness direction) in the substrate plane of the microstructure.

Embodiments of the present invention will be explained below in detail with reference to the drawings.

First Embodiment

Figure 1:
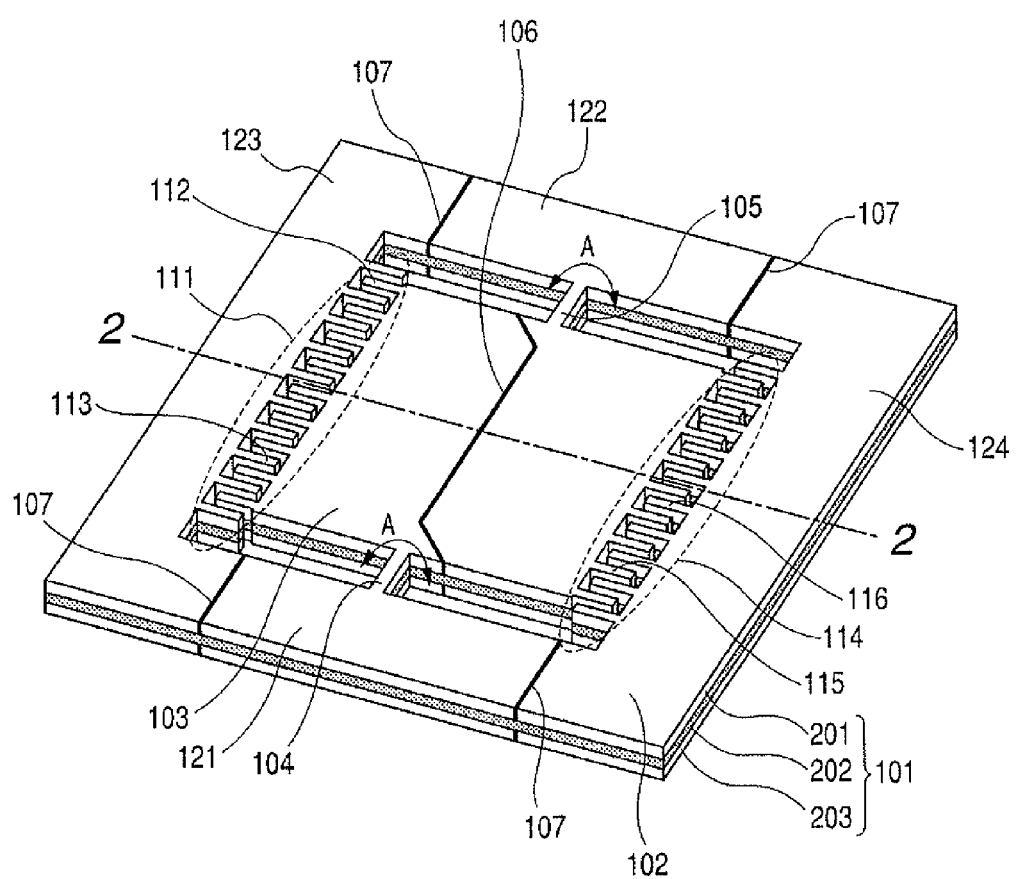
FIG. 1 is a perspective view of an actuator according to a first embodiment of the present invention.

The first embodiment will be explained with reference to FIGS. 1, 2, 3A and 3B. FIG. 1 is a perspective view of an actuator, according to the first embodiment, which converts input electric energy into physical motion. In FIG. 1, numeral 101 denotes a substrate, 102 denotes a support portion, 103 denotes a movable body, 104 and 105 denote support springs, 106 and 107 denote insulating portions, and 111 and 114 denote electrostatic comb elements. Numerals 112 and 115 denote movable electrodes, 113 and 116 denote stationary electrodes, 121 denotes a first electrode, 122 denotes a second electrode, 123 denotes a third electrode, and 124 denotes a fourth electrode.

A substrate in which an insulating layer is sandwiched between plural silicon layers, such as an SOI substrate, can be used for the substrate 101. In the present embodiment, a substrate in which an insulating film 202 is provided between two silicon layers 201 and 203 is used. The movable body 103, support springs 104 and 105, electrostatic comb elements 111 and 114, and support portion 102 can be manufactured easily by hollowing out the substrate 101.

The movable body 103 is oscillatably supported about a rotation axis of the support portion 102 by two support springs 104 and 105. In the present embodiment, the rotation axis of the movable body 103 coincides with the center of the sections of the support springs 104 and 105 to establish such a spring structure that rotation in the direction of an arrow A is easily produced. The electrostatic comb elements 111 and 114 are respectively composed of the movable comb electrodes 112 and 115 arranged on the movable body 113 and the stationary comb electrodes 113 and 116 fixed to the supporting portions. Plural (two in the present embodiment) electrostatic comb elements 111 and 114 are arranged so as to be symmetric with respect to the rotation axis of the movable body 103 in the plane of the support portion 102.

The actuator shown in FIG. 1 is separated into the first electrode 121, second electrode 122, third electrode 123, and fourth electrode 124 in the substrate plane by the insulating portion 106 and the insulating portion 107. Specifically, it is electrically separated in the substrate plane in the direction of crossing the rotation axis. In the present embodiment, the structure of the actuator itself (support portion 102, movable body 103, support springs 104 and 105) is used as an electric wiring. The first electrode 121 is electrically connected to the left portion of the movable body 102 through the support spring 104, and the second electrode 122 is electrically connected to the right portion of the movable body 102 through the support spring 105. Specifically, the first electrode 121 is connected to the movable electrode 112 at the left of the movable body 102, while the second electrode 122 is connected to the movable electrode 115 at the right of the movable body 102. The third electrode 123 is connected to the stationary electrode 113 that is opposite to the movable electrode 112 at the left of the movable body 102, while the fourth electrode 124 is connected to the stationary electrode 115 that is opposite to the movable electrode 115 at the right of the movable body 102.

The silicon layer 201 on the top surface of the substrate 101 has been explained above. The actuator shown in FIG. 1 is electrically insulated and separated in the thickness direction of the substrate by the insulating film 202 between two silicon layers 201 and 203. Therefore, at the second silicon layer 203 positioned at the lower part of the first to fourth electrodes, their corresponding fifth to eighth electrodes respectively having the same shape and arranged at the same position are arranged. Accordingly, the actuator is configured to be capable of having eight different potentials in total.

Figure 2:
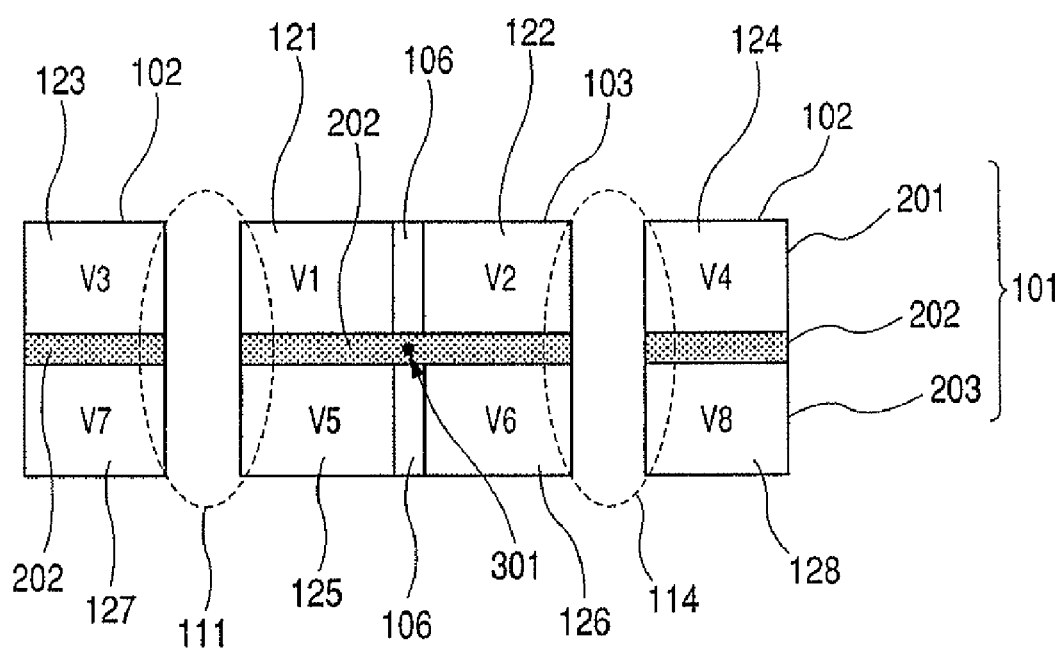
FIG. 2 is a sectional view of the actuator in the direction vertical to a substrate at 2-2 line in FIG. 1, when the actuator is not driven.

FIG. 2 is a sectional view of the actuator in the direction perpendicular to the substrate 101 along a straight line 2-2 in FIG. 1 when the actuator is not driven, i.e., when the actuator is in its neutral state (in the state in which the movable body 103 is not rotated). Numeral 125 denotes the fifth electrode, 126 denotes the sixth electrode, 127 denotes the seventh electrode, 128 denotes the eighth electrode, and 301 denotes a center of the rotation of the movable body 103. In the present embodiment, the potential of the first electrode 121 is defined as V1, the potential of the second electrode 122 is defined as V2, the potential of the third electrode 123 is defined as V3, the potential of the fourth electrode 124 is defined as V4, the potential of the fifth electrode 125 is defined as V5, the potential of the sixth electrode 126 is defined as V6, the potential of the seventh electrode 127 is defined as V7, and the potential of the eighth electrode 128 is defined as V8.

As described above, the feature of the present embodiment is such that the movable body 103 has four conductive regions that are electrically insulated and separated, and the movable body 103 can be separated into four regions each having an independent potential, i.e., V1, V2, V5 and V6.

Figure 3A:
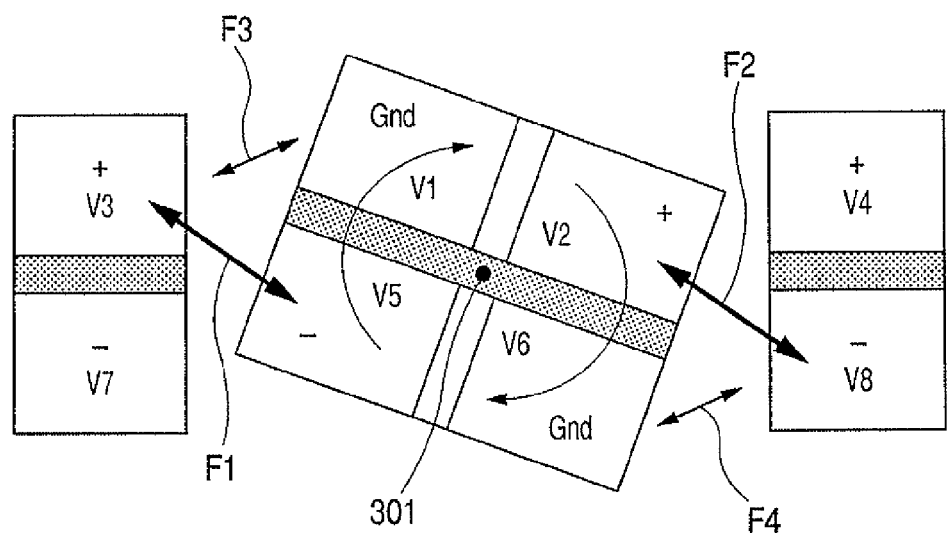
FIGS. 3A and 3B are views at the section same as that in FIG. 2, when the actuator is driven.
Figure 3B:
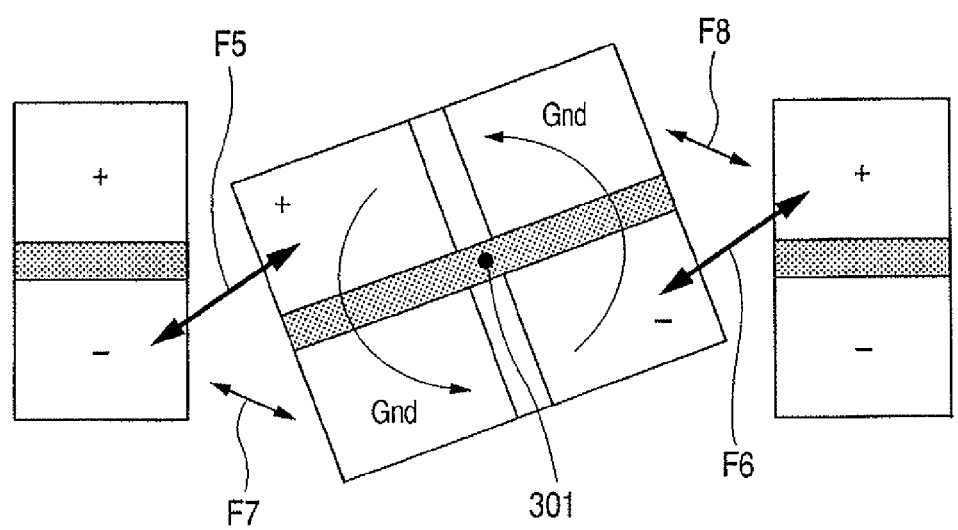

The method of driving the movable body 103, which has four independent potentials, will be explained. FIGS. 3A and 3B are sectional views, which is the same as that in FIG. 2, when the actuator is driven. In FIGS. 3A and 3B, '+' represents a positive potential, '−' represents a negative potential, Gnd represents a reference potential, and F1 to F8 illustrate electrostatic force generated on the electrostatic comb elements 111 and 114. In FIGS. 3A and 3B, V3=+ (that means a positive potential, the same is true below), V4=+, V7=− (that means a negative electrode, the same is true below.), and V8=−. In this case, these are not changed.

In FIG. 3A, V1=Gnd, V2=+, V5=−, and V6=Gnd in the movable body 103, and they are switched. When there is a potential difference between the electrostatic comb elements 111 and 114, electrostatic force is produced, and they attract each other. Therefore, the electrostatic force F1 is produced between the third electrode 213 (+) and the fifth electrode 215 (−), and the electrostatic force F2 is produced between the second electrode 212 (+) and the eighth electrode 218 (−). Accordingly, in the movable body 103 shown in FIG. 3A, the upward force is produced at the left portion, while the downward force is produced at the right portion, whereby the whole movable body 103 rotates in the clockwise direction about the rotation axis 301.

On the other hand, the electrostatic force F3 is produced between the first electrode 211 (Gnd) and the third electrode 213 (+), while the electrostatic force F4 is produced between the sixth electrode 214 (Gnd) and the eighth electrode 218 (−). Since the potential difference between the electrodes on which the electrostatic force is produced is smaller, compared to the potential difference between the forces F1 and F2, these forces F3 and F4 are smaller than F1 and F2. Further, the forces F3 and F4 are exerted between the electrodes that are being apart from each other, and the magnitude of the electrostatic force is inversely proportional to the square of the distance between the electrodes, whereby the forces F3 and F4 are considerably small compared to the F1 and F2. Therefore, although the F3 and F4 are the forces in the direction of hindering the clockwise rotation of the movable body 103, the influence of the forces F3 and F4 on the rotation can be greatly reduced. Accordingly, the electrostatic force that suppresses the rotation is reduced to thereby achieve the rotation by the electrostatic comb elements with high driving efficiency.

Next, in FIG. 3B, V1=+, V2=Gnd, V5=Gnd, and V6=−. Therefore, the electrostatic force F5 is produced between the first electrode 211 (+) and the fifth electrode 215 (−), and the electrostatic force F6 is produced between the fourth electrode 214 (+) and the sixth electrode 216 (−). Accordingly, in the movable body 103 shown in FIG. 3B, the downward force is produced at the left portion, while the upward force is produced at the right portion, whereby the whole movable body 103 rotates in the counterclockwise direction about the rotation axis 301.

On the other hand, the electrostatic force F7 is produced between the fifth electrode 215 (Gnd) and the seventh electrode 217 (−), while the electrostatic force F8 is produced between the second electrode 212 (Gnd) and the fourth electrode 214 (+). These forces F7 and F8 are forces in the direction of hindering the clockwise rotation of the movable body 103. However, the influence of the forces F7 and F8 on the rotation can greatly be reduced for the same reason as in FIG. 3A.

As in the state of FIG. 3A and the state of FIG. 3B, when the application of the electrostatic force is stopped after the movable body 103 is rotated to a predetermined position, the movable body 103 starts to rotate in the reverse direction due to the torque of the support spring 104. Therefore, when the potential applied state shown in FIG. 3A and the potential applied state shown in FIG. 3B are alternately repeated at such a timing as to generate the motion described above, the movable body 103 can be rotated in a desired manner. In the present embodiment, the potential of each electrode region of the movable body 103 is controlled to be changed, and the potential of the stationary electrode regions are controlled to be fixed. However, the method of controlling the potential is not limited thereto, but may appropriately be determined according to desired oscillating manners, structure of the actuator, or the like. In any case, a more delicate control is possible by separating the conductive region of the electrode like the present embodiment. Although three potentials "+", "−", and "Gnd" are used for the electrostatic driving, the invention is not limited thereto. Any potentials may be employed, so long as they are three different potentials. They may also appropriately be determined according to the desired oscillating manner, structure of the actuator, or the like. These are true for the other embodiments.

As described above, the microstructure according to the present embodiment can reduce the electrostatic force, which suppresses the rotation, thereby being capable of realizing an actuator with excellent driving efficiency.

Second Embodiment

The second embodiment will be explained. The present embodiment is the same as the first embodiment except that the present embodiment has such a feature that the rotation condition of the movable body is detected when the actuator is driven.

In the present embodiment, the rotation condition is detected by utilizing an electrode section used as a reference potential (Gnd). In a case where the rotation condition is detected, the actuator is configured such that an input side of current (charge)-voltage conversion circuit is connected to the electrode section. The present embodiment will be explained in detail below.

Figure 4:
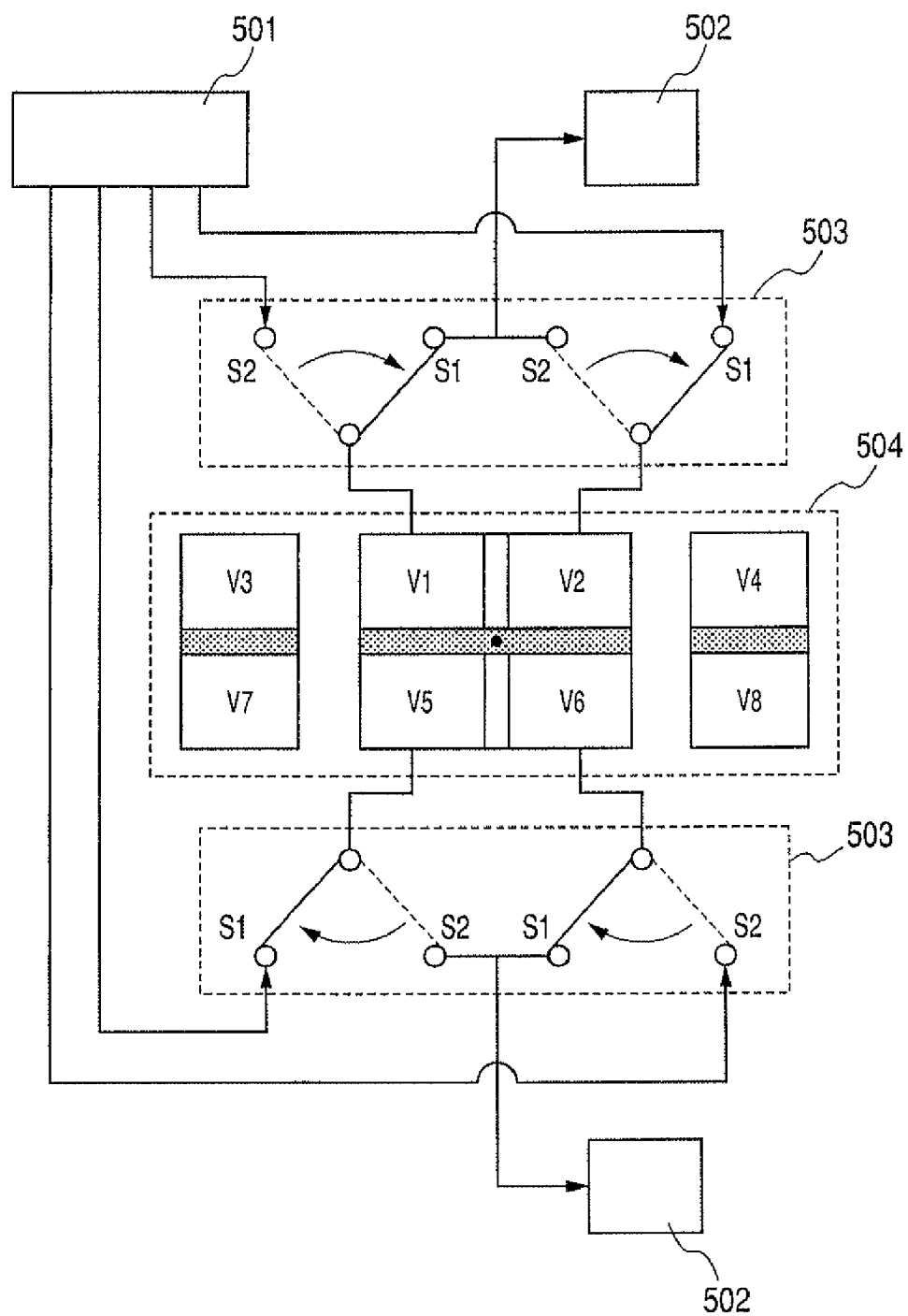
FIG. 4 is a block diagram for explaining a drive and a detection of an actuator according to a second embodiment of the present invention.

FIG. 4 is a block diagram for explaining the drive and detection of the actuator according to the second embodiment. Numeral 501 denotes a drive generating portion, 502 denotes a rotation condition detection portion, 503 denotes a signal switching portion, and 504 denotes an actuator (whose section is illustrated).

When the movable body 103 is tilted to the right as shown in FIG. 3A, the signal switching portion 503 is changed to S1, whereby the potentials V2 and V5 can be applied to the second electrode and the fifth electrode from the drive generating portion 501. Therefore, the clockwise rotation is produced on the movable body 103 as explained in the first embodiment.

On the other hand, the first electrode and the sixth electrode have the same potential as the reference potential (Gnd) of the rotation condition detection portion 502. Therefore, the influence of the suppression force on the electrostatic attraction, which is produced between the third electrode and the fifth electrode as well as between the second electrode and the eighth electrode, can be reduced. Further, the induced charge is simultaneously induced to the first electrode and the sixth electrode due to the potentials of the third electrode and the eighth electrode through the movement of the movable body 103. When the amount of the induced charge is measured, the positional relationship between the movable body 103, which is a vibrator, and the stationary electrode can be known, whereby the rotation condition of the movable body 103 can be detected. The amount of the induced charge is measured at the rotation condition detection portion 502, which is connected to the first electrode and the sixth electrode, by the signal switching portion 503.

On the other hand, when the movable body 103 is to be tilted to the left as shown in FIG. 3B, the signal switching portion 503 is changed to S2, whereby the potentials V1 and V6 can be applied to the first electrode and the sixth electrode. Therefore, the counterclockwise rotation is produced on the movable body 103 as explained in the first embodiment. On the other hand, the second electrode and the fifth electrode have the same potential as the reference potential (Gnd) of the rotation condition detection portion 502. Accordingly, the amount of the charge induced to the second electrode and the fifth electrode is detected by the rotation condition detection portion 502.

Figure 5A:
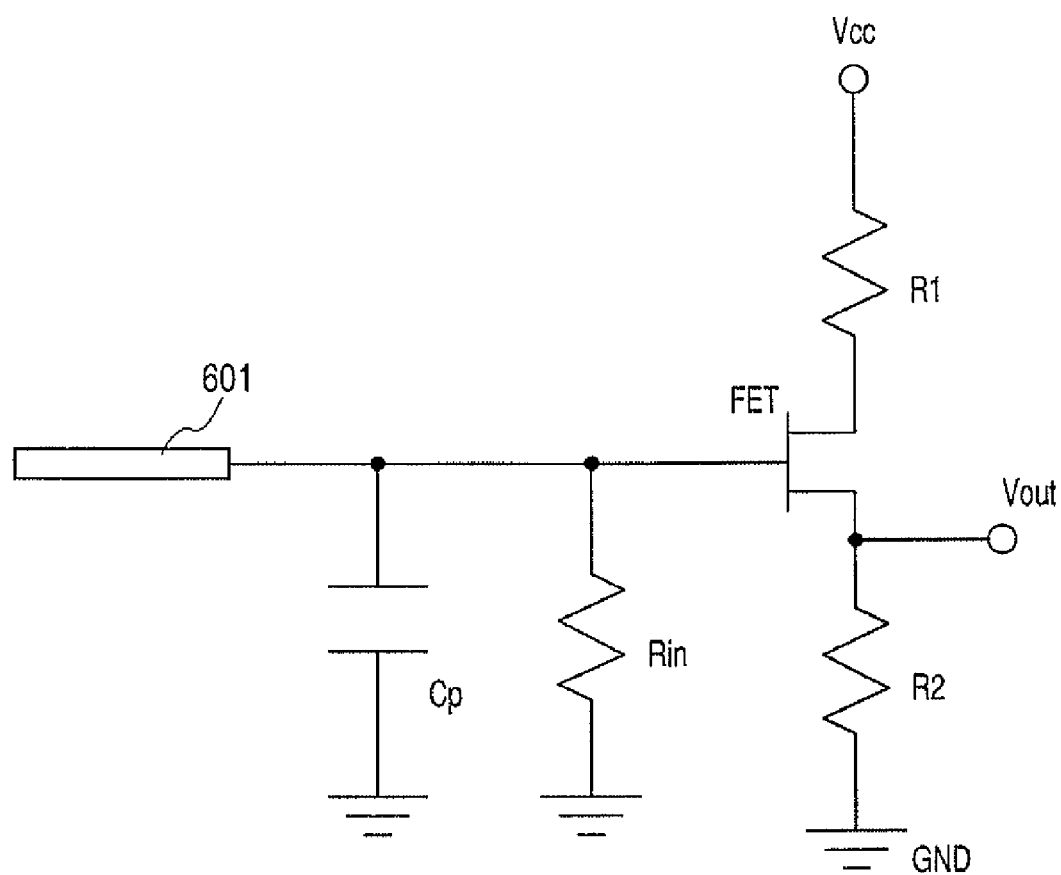
FIG. 5A is a view for explaining one example of a current (charge)-voltage conversion circuit that is a rotation condition detection portion.

An example of the current (charge)-voltage conversion circuit, which is the rotation condition detection portion 502, will be explained with reference to FIGS. 5A and 5B. FIG. 5A is a current (charge)-voltage conversion circuit using a resistance, while FIG. 5B is a transimpedance circuit using an operational amplifier.

In the circuit in FIG. 5A, numeral 601 denotes a detection electrode (any one of electrodes connected to this circuit), Cp denotes a parasitic capacitance, Rin denotes a high resistance, R1 and R2 denote resistances, FET denotes an FET element, Vout denotes an output voltage, and GND denotes a circuit ground. In the circuit in FIG. 5B, numeral 601 denotes a detection electrode, OP-AMP denotes an operational amplifier, Rf denotes a feedback resistance, Cf denotes a feedback capacitance, Cp denotes a parasitic capacitance, Vout denotes an output voltage, and GND denotes a circuit ground.

Figure 5B:
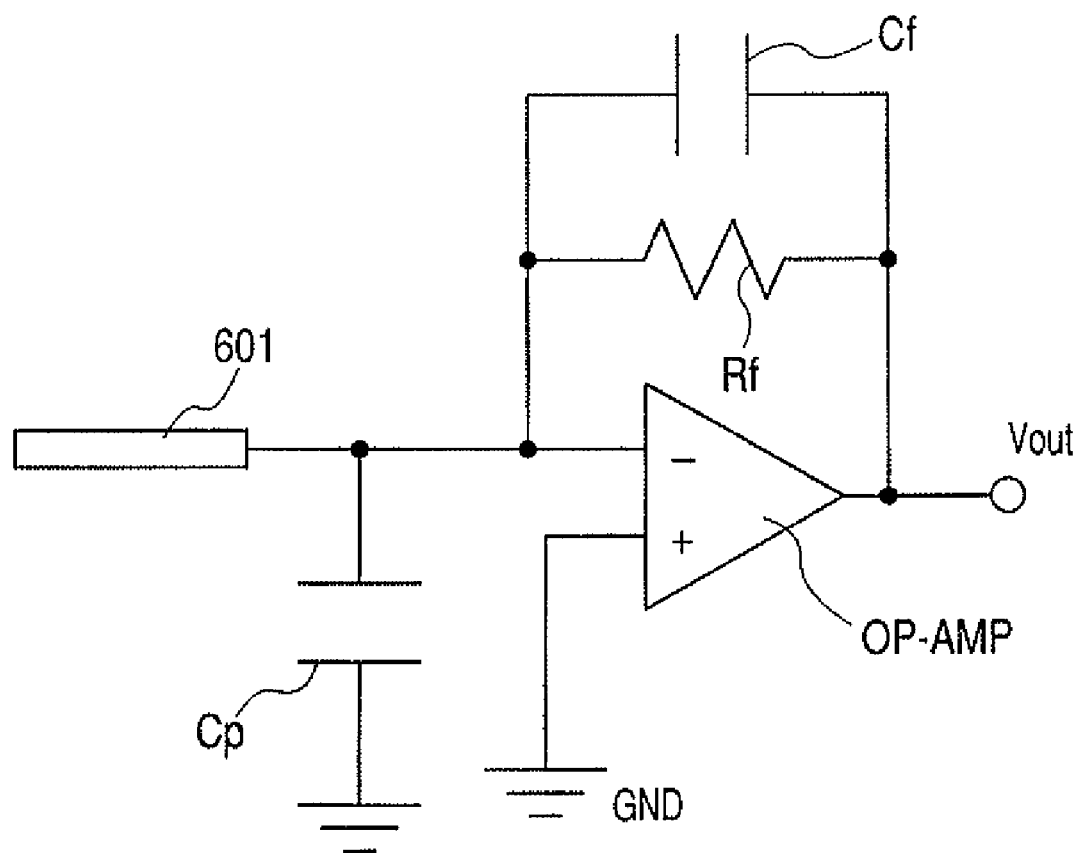
FIG. 5B is a view for explaining another example of a current (charge)-voltage conversion circuit that is a rotation condition detection portion.

In FIGS. 5A and 5B, the detection electrode 601 is fixed to the potential which is substantially the same as the ground Gnd that is the reference potential of the circuit. In the circuit in FIG. 5A, a potential is produced to the gate electrode of the FET by the induced charge, wherein the FET is controlled according to the magnitude of the potential to thereby convert the potential into a voltage signal. In the circuit in FIG. 5B, a potential is produced to the feedback portion (Rf, Cf) of the operational amplifier by the induced charge, wherein the potential is converted into a voltage signal as Vout.

As described above, the microstructure according to the present embodiment includes the potential application portion that applies a potential to the conductive region for oscillating the movable body, and the detection portion that detects the magnitude of the induced charge induced to the conductive region for detecting the rotation condition of the movable body. With this structure, the present embodiment can realize an actuator that can monitor the rotation condition of the movable body, feed back the result of the monitor, and reflect the result of the monitor on the drive potential signal.

Figure 6:
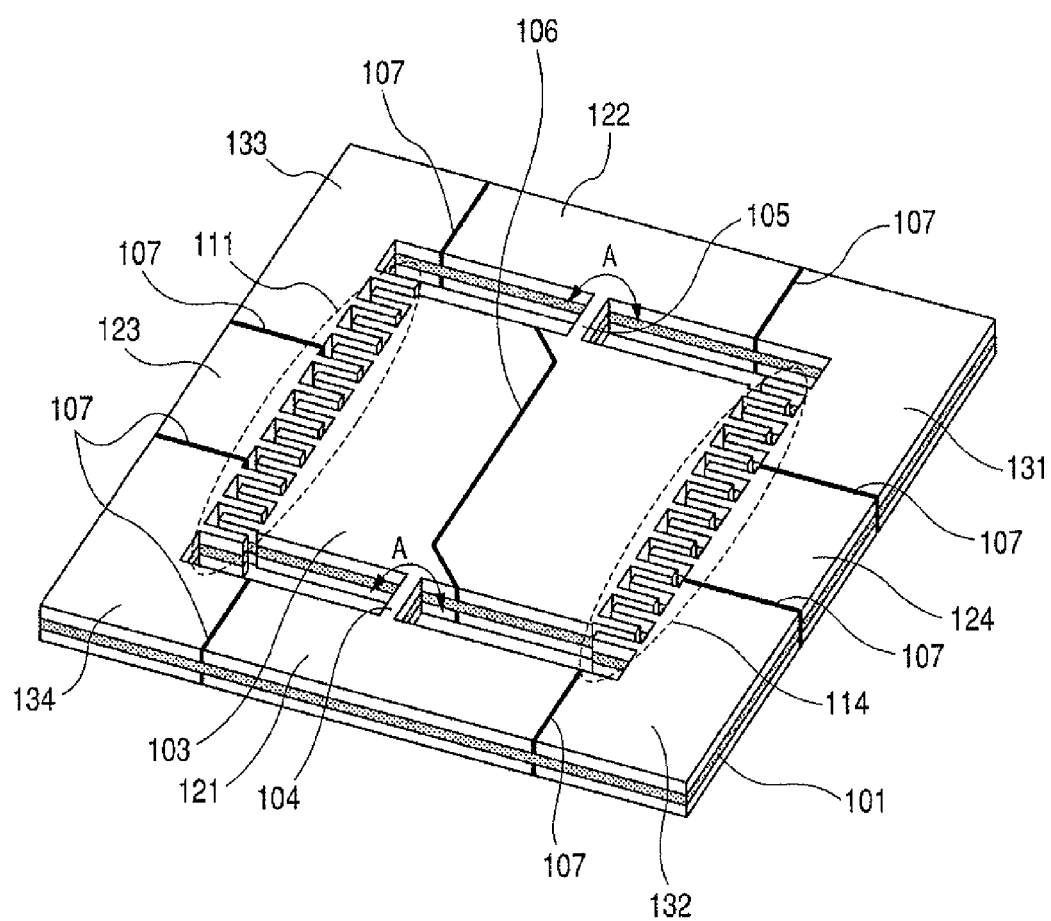
FIG. 6 is a perspective view for explaining another embodiment of the second embodiment.

The aforesaid structure can be modified as described below. Specifically, the third electrode 123, the fourth electrode 124, the seventh electrode and the eighth electrode in FIG. 1 are respectively separated and insulated, wherein each electrode can be exclusively used for the drive and the detection of the rotation condition of the movable body 30. FIG. 6 is a perspective view for explaining the modification. In FIG. 6, numeral 131 denotes a ninth electrode exclusively used for the detection, 132 denotes a tenth electrode exclusively used for the detection, 133 denotes an eleventh electrode exclusively used for the detection, and 134 denotes a twelfth electrode exclusively used for the detection. The third electrode 123 and the fourth electrode 124 are exclusively used for the drive of the movable body 103.

As described above, the first electrode 121, the second electrode 122, the third electrode 123, and the fourth electrode 124 are used for the drive. On the other hand, the ninth electrode 131, the tenth electrode 132, the eleventh electrode 133, and the twelfth electrode 134 are used for detecting the induced charge generated through the oscillation of the movable body 103. Only the first silicon layer 201 is illustrated in FIG. 6. However, electrodes separated in the same manner as in the first silicon layer 201 are arranged on the second silicon layer 203.

By virtue of the structure described above, the drive of the movable body 103 and the monitoring of the rotation condition of the movable body 103 can be executed without using the signal switching portion 503 shown in FIG. 4. Therefore, the signal of the rotation condition of the movable body 103 can always be acquired, whereby the rotation condition of the movable body 103 can be detected with high precision. Instead of the aforesaid structure, the stationary electrodes are not separated, and the separated electrodes of the movable body 103 are further electrically separated into three, so that electrodes exclusively used for the drive and electrodes exclusively used for the detection can be arranged.

Third Embodiment

The third embodiment is the same as the second embodiment except that the oscillator device including the movable body 103 is used as a sensor.

The operation of the microstructure of the oscillator device shown in FIG. 1 will be explained, when the oscillator device is used as a sensor. It is supposed here a sensor that detects the force for rotating the movable body 103 in the direction shown by an arrow A is used. The present embodiment is characterized in that the potentials of the four electrically separated electrode regions of the movable body 103 are used for the detection of the rotation condition of the movable body 103 and for the production of the force for suppressing the rotation of the movable body 103.

Specifically, when the movable body 103 is to rotate in the direction of A due to external force, a signal corresponding to the magnitude of the rotation of the movable body 103 is detected by some electrode regions. A drive signal is applied to a suitable electrode region of the movable body 103 in such a manner that the detection signal indicates that the movable body 103 is not oscillating. Therefore, the movable body is maintained to an initial state, and the external force exerted on the movable body 103 and the electrostatic force caused by the potential applied to the movable body 103 are balanced. Accordingly, the magnitude of the external force can be detected by calculating the magnitude of the applied electrostatic force. The magnitude of the electrostatic force can be calculated from the shape of the electrostatic comb elements and the applied potential. In this embodiment, it is only necessary to perform the detection as to whether there is a slight oscillation of the movable body 103 or not, whereby a high-sensitive detection can be performed. Since the movable body 103 does not greatly rotate, there is not such a possibility that non-linear movable characteristics of the movable body 103 occur to give an adverse affect to the detection. Consequently, a high-sensitive detection can be carried out.

As described above, the microstructure according to the present embodiment has a detection portion that applies a potential to the conductive region so as to prevent the movable body from rotating about the rotation axis due to the external force and detects the external force on the basis of the applied potential. Therefore, the present embodiment can realize a high-precision sensor.

Fourth Embodiment

The fourth embodiment is the same as any one of the first to third embodiments except that the fourth embodiment has a feature at the insulating portions 106 and 107.

Figure 7A:
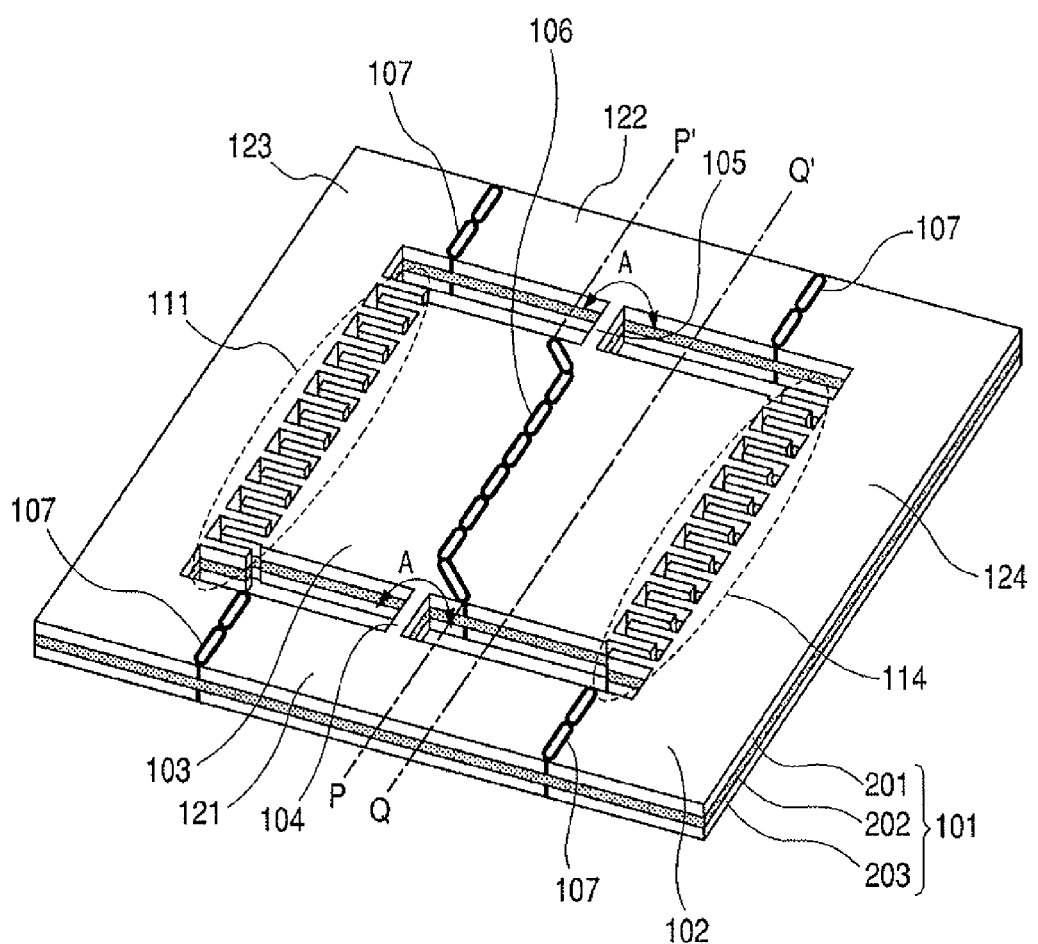
FIG. 7A is a view for explaining a microstructure according to a third embodiment.
Figure 7B:
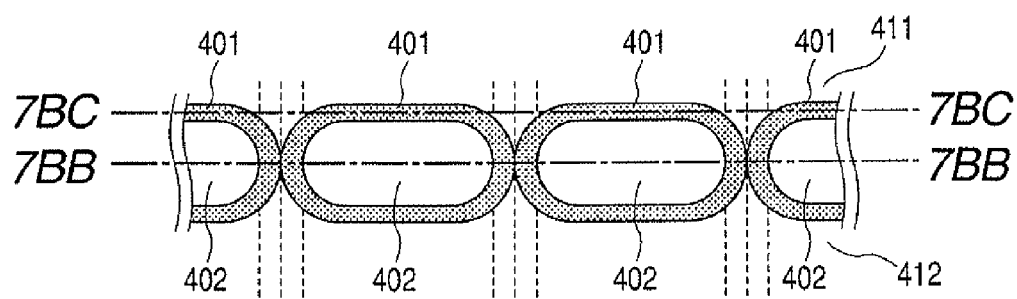
FIGS. 7BA, 7BB and 7BC are views for explaining an insulating portion of an oxidized region according to the third embodiment.
Figure 7B:
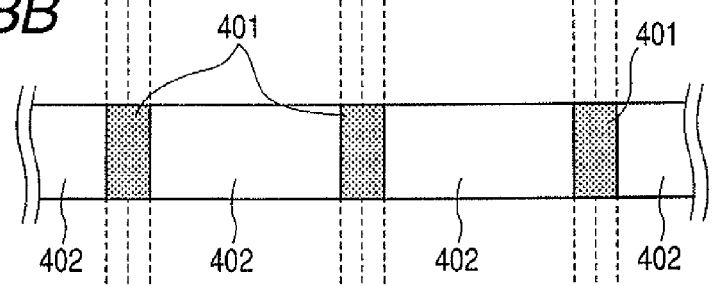
Figure 7B:
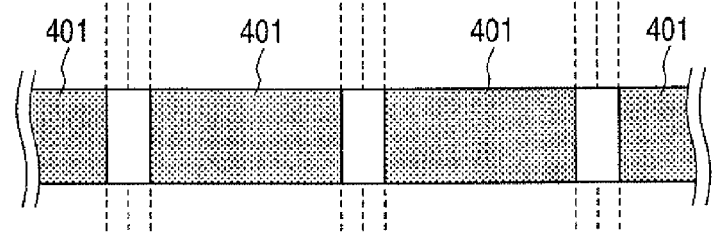

The present embodiment is characterized in that the insulating portion has a through-hole or a groove. FIG. 7A is a perspective view of a microstructure according to the present embodiment. FIGS. 7BA, 7BB and 7BC are views in which a part of a thermally oxidized film 401 having through-holes 402 is enlarged at the insulating portion. FIG. 7BA is a top view of the substrate, FIG. 7BB is a sectional view of the substrate along a straight line of 7BB-7BB, and FIG. 7BC is a sectional view of the substrate along a straight line of 7BC-7BC. In FIGS. 7BA, 7BB, and 7BC, numeral 411 denotes a first region, and numeral 412 denotes a second region. The first region 411 and the second region 412 become various regions depending upon the positions of the insulating portions 106 and 107.

In the structure in FIGS. 7BA, 7BB and 7BC, the thermally oxidized film 401 is continuously formed so as to separate the first region 411 and the second region 412. Therefore, the thermally oxidized film 401 can electrically insulate the first region 411 and the second region 412 from each other. Since the thermally oxidized film 401 has plural through-holes, the size of the insulating material (thermally oxidized film) that connects the first region 411 and the second region 412 can be reduced to a minimum which can ensure a required mechanical strength. Accordingly, compared to the structure in which an insulating film having no through-holes is arranged, a microstructure that is less susceptible to the deformation of the movable body or the substrate, which is caused by the influence of stress of the thermally oxidized film, can be realized. Further, the magnitude of the parasitic capacitance caused between the first region 411 and the second region 412 can be suppressed.

Figure 9A:
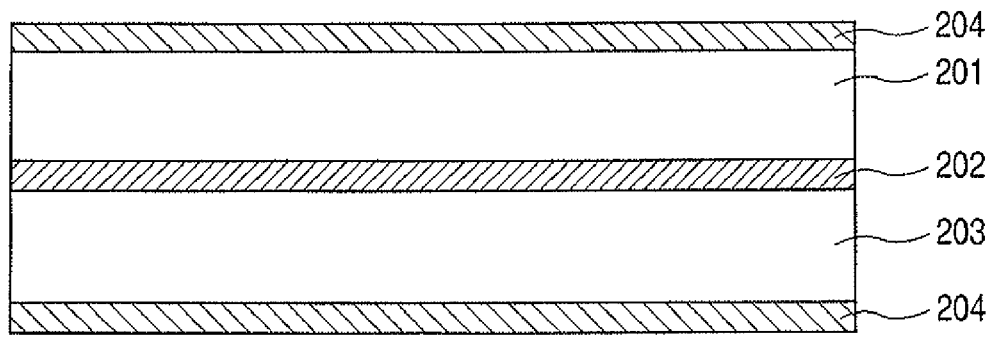
FIGS. 9A, 9AA, and 9AB are views for explaining a manufacturing method of the microstructure according to the third embodiment.
Figure 9A:
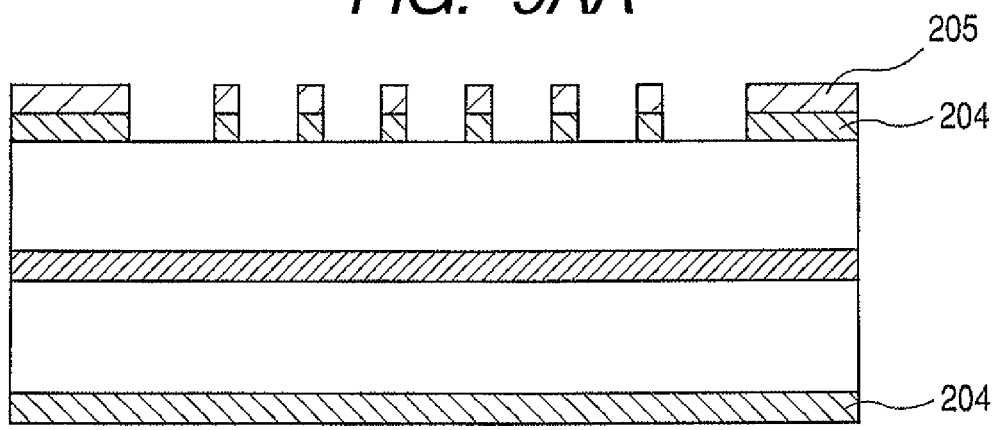
Figure 9A:
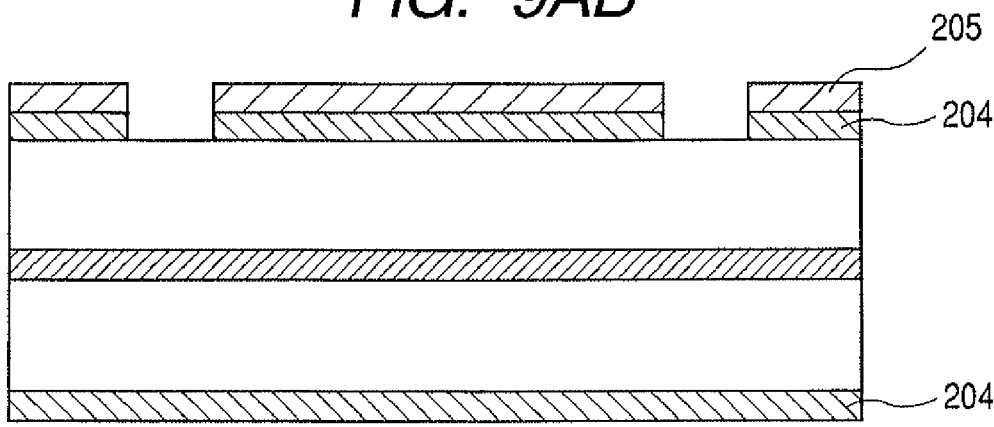

FIGS. 9A to 9EB are views for explaining the manufacturing method of the microstructure according to the present embodiment. The method includes a step of spacing plural through-holes on a base material, and a step of forming a continuous oxidized region (oxide) including the plural through-holes at least by the thermal oxidation to the base material at the inner surface of the plural through-holes so as to form electrically insulated plural conductive regions on the base material. FIGS. 9AA, 9BA, 9CA, 9DA and 9EA illustrate the section along a broken line P-P' in FIG. 7A, while FIGS. 9AB, 9BB, 9CB, 9DB and 9EB illustrate the section along a broken line Q-Q' in FIG. 7A. It is to be noted that, in FIGS. 9AA, 9BA, 9CA, 9DA and 9EA, the number of the through-holes at the portion corresponding to the movable body 103 is decreased for the purpose of easy understanding. In FIGS. 9A to 9EB, numeral 201 denotes a first silicon layer that is a base material for forming the substrate or the movable body, 202 denotes an oxidized film, 203 denotes a second silicon layer that is a base material for forming the substrate or the movable body, 204 denotes a second mask material, 205 denotes a first mask material, 210 denotes through-holes at the oxidized region, and 211 denotes an thermally oxidized film.

In the present embodiment, an SOI substrate having the thermally oxidized film 202 between the first silicon layer 201 and the second silicon layer 203 is used. The second mask material 204 is formed on both surfaces of the SOI substrate. In the present embodiment, a silicon nitride film is used (FIG. 9A).

Next, the first mask material 205 is formed on one surface of the substrate, whereby the first mask material 205 and the second mask material 204 are processed into an arbitrary pattern with photolithography or etching (FIGS. 9AA, 9AB).

Figure 9B:
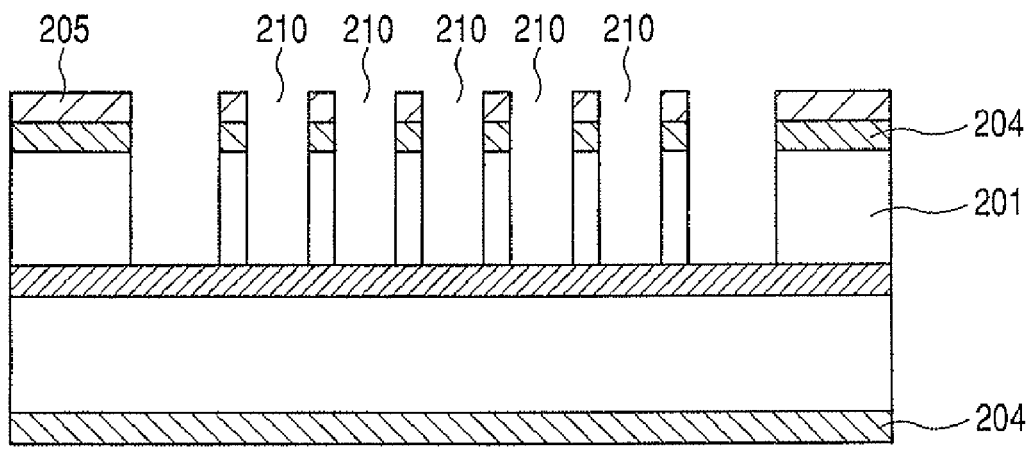
FIGS. 9BA and 9BB are views for explaining a manufacturing method of the microstructure according to the third embodiment.
Figure 9B:
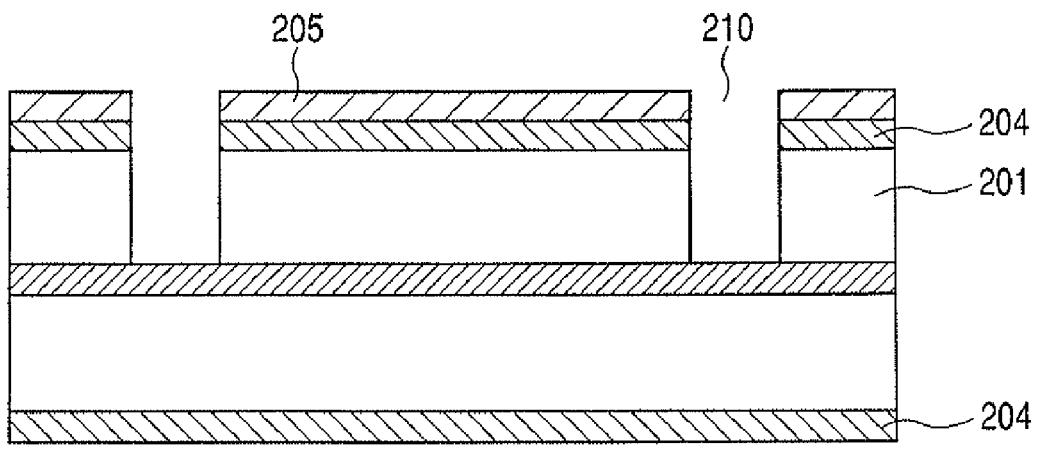

Then, the first silicon layer 201 is etched into an arbitrary pattern with the first mask material 205 used as a mask (FIGS. 9BA, 9BB). In the present embodiment, anisotropic etching is performed on the surface of the substrate, having formed thereon the first mask material 205, which has no mask, so as to form through-holes 210 on the first silicon layer 201. A dry etching such as Si-Deep-RIE can be employed as the anisotropic etching. A metal such as Al (aluminum), silicon nitride, silicon oxide, polysilicon, etc. can be used for the first mask material 205. The mask material is not limited thereto.

Figure 9C:
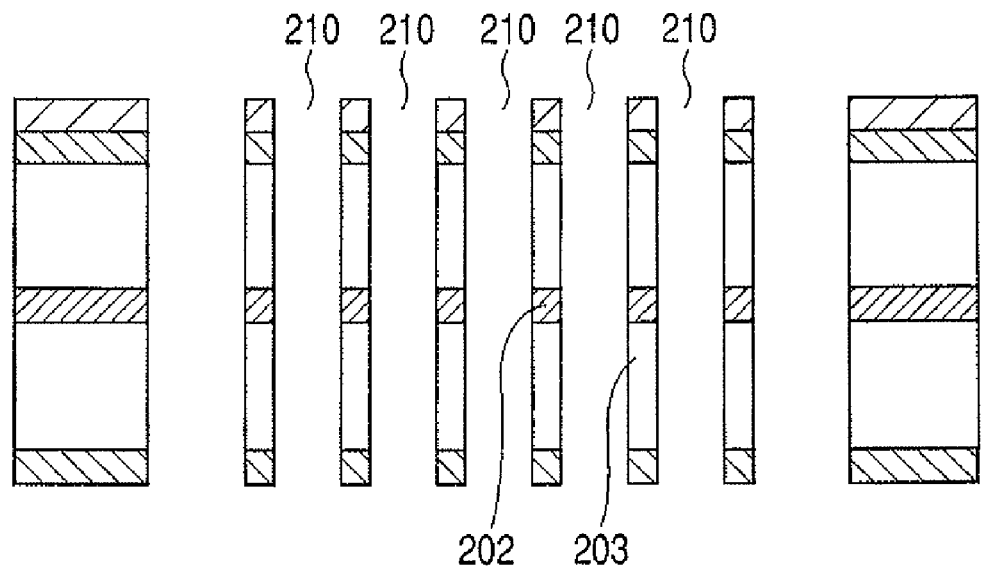
FIGS. 9CA and 9CB are views for explaining a manufacturing method of the microstructure according to the third embodiment.
Figure 9C:
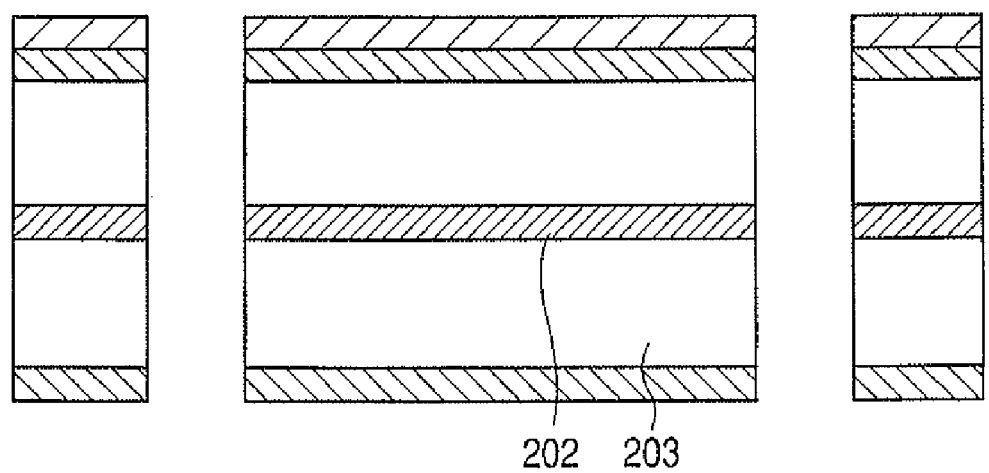

Subsequently, the exposed portion of the oxidized film 202 between the silicon layers is removed by etching. Thereafter, the second silicon layer 203 is processed by means of the anisotropic etching in the same manner as described above. The second silicon layer 203 is formed into a shape that is obtained by transferring the substantial shape of the first mask material 205, because the anisotropic etching is carried out. After the second silicon layer 203 is processed, the second mask material 204 formed on the lower surface of the SOI substrate is etched with the same shape of the first mask material 205 (FIGS. 9CA, 9CB).

Figure 9D:
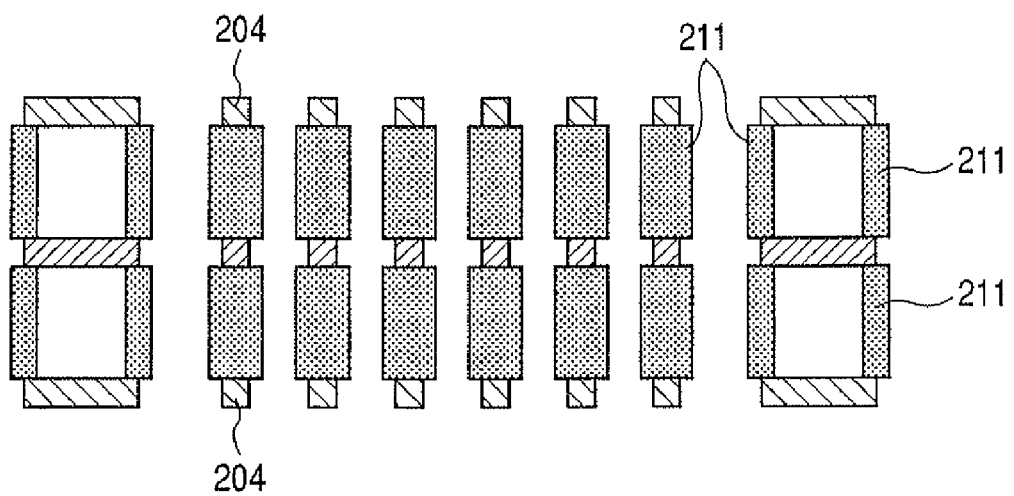
FIGS. 9DA and 9DB are views for explaining a manufacturing method of the microstructure according to the third embodiment.
Figure 9D:
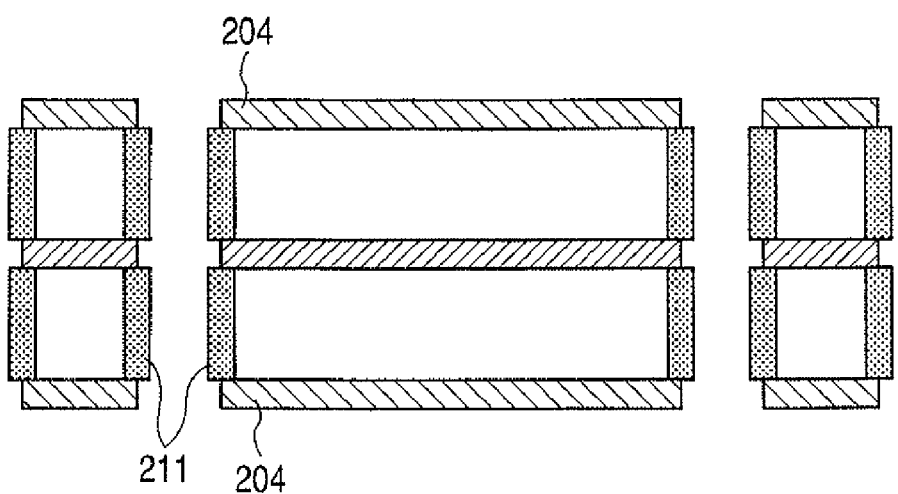
Figure 9E:
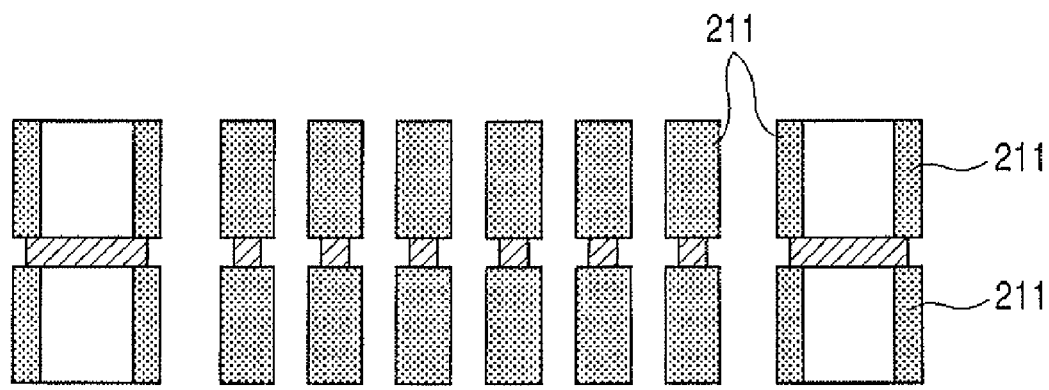
FIGS. 9EA and 9EB are views for explaining a manufacturing method of the microstructure according to the third embodiment.
Figure 9E:
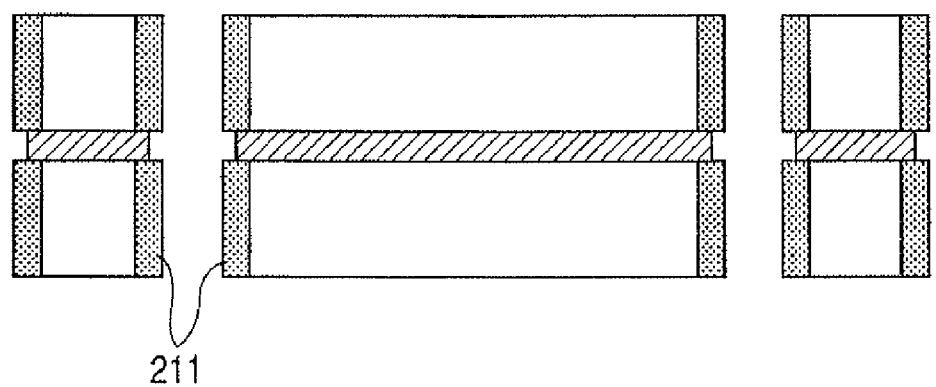

Thereafter, the first mask material 205 is removed, the substrate is cleaned, and the thermal oxidation is performed on the surface of the silicon. During the thermal oxidation process, the silicon is left for a long time under an oxygen atmosphere with a temperature of not less than 1000° C., whereby the oxidized silicon 211 is grown on the exposed silicon (FIGS. 9DA, 9DB). This oxidized silicon not only grows on the surface of the silicon, but also grows as spreading the oxidized region to the inside from the surface of the silicon (the ratio of the thickness of the former and the latter is approximately 55:45).

Figure 8A:
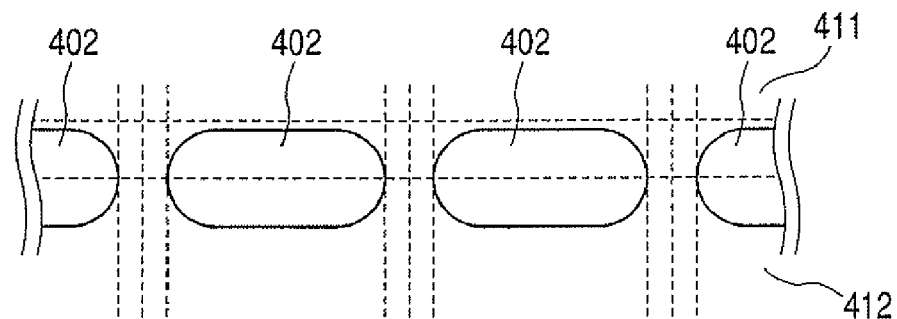
FIGS. 8A, 8B and 8C are top views of the substrate for explaining the progression of a thermal oxidization.
Figure 8B:
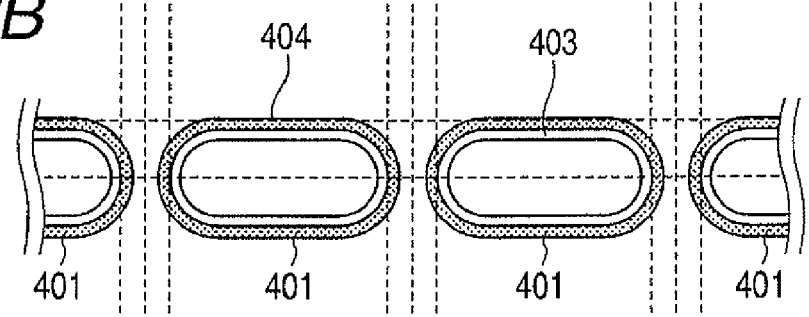
Figure 8C:
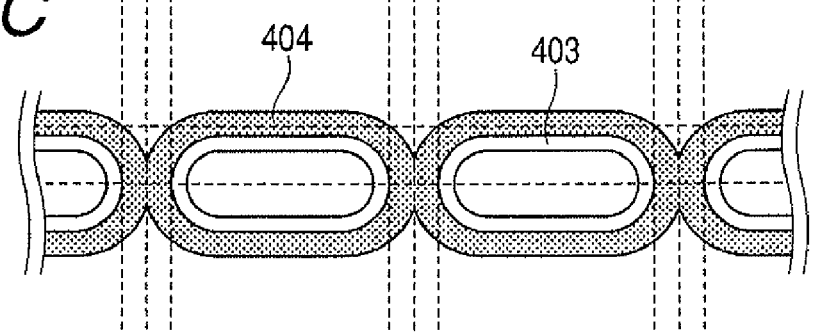

The thermal oxidation process will be explained here. FIGS. 8A to 8C are top views of the substrate for explaining the progression of the thermal oxidation. In FIGS. 8A to 8C, numeral 401 denotes the thermally oxidized film, 402 denotes the through-hole, 411 denotes the first region, and 412 denotes the second region. Numeral 403 denotes the thermally oxidized film on the surface of the silicon, and 404 denotes the thermally oxidized film formed in the silicon. The thermally oxidized film 401 is composed of two types of the thermally oxidized films, i.e., the thermally oxidized film 403 on the surface of the silicon and the thermally oxidized film 404 formed inside of the silicon.

FIG. 8A shows the state before the oxidation. All the portions between the through-holes 402 are silicon, so that the first region 411 and the second region 412 are not insulated from each other.

FIG. 8B shows the state in which the thermal oxidation is performed for a time half the predetermined time. In this case, the thermally oxidized film 403 grows on the surface of the through-hole 402, and the thermally oxidized film 404 also grows inside of the silicon, whereby the width of the silicon present between the adjacent through-holes 402 is reduced.

Therefore, the resistivity between the first region 411 and the second region 412 is increased slightly than the previous state.

Finally, FIG. 8C shows the state in which the thermal oxidation is performed for the predetermined time. At this point, the thermally oxidized films 404 grown inside of the silicon from the adjacent through-holes 402 are brought into contact with each other, and they are integrated. Accordingly, the first region 411 and the second region 412 are insulated from each other.

Returning to FIGS. 9A to 9EB, the second mask material 204 used for the thermal oxidation may finally be removed (FIGS. 9EA, 9EB), or may not be removed unless there are any characteristic problems.

As described above, according to the microstructure of the present embodiment, the insulation in the movable body having small stress can be achieved with a simple structure. Further, the insulation in the movable body can be realized by a simple manufacturing method.

Fifth Embodiment

The fifth embodiment is the same as any one of the first to fourth embodiments except that the position of the insulating portion in the movable body 103 is different from that in the above-mentioned embodiments.

Figure 10:
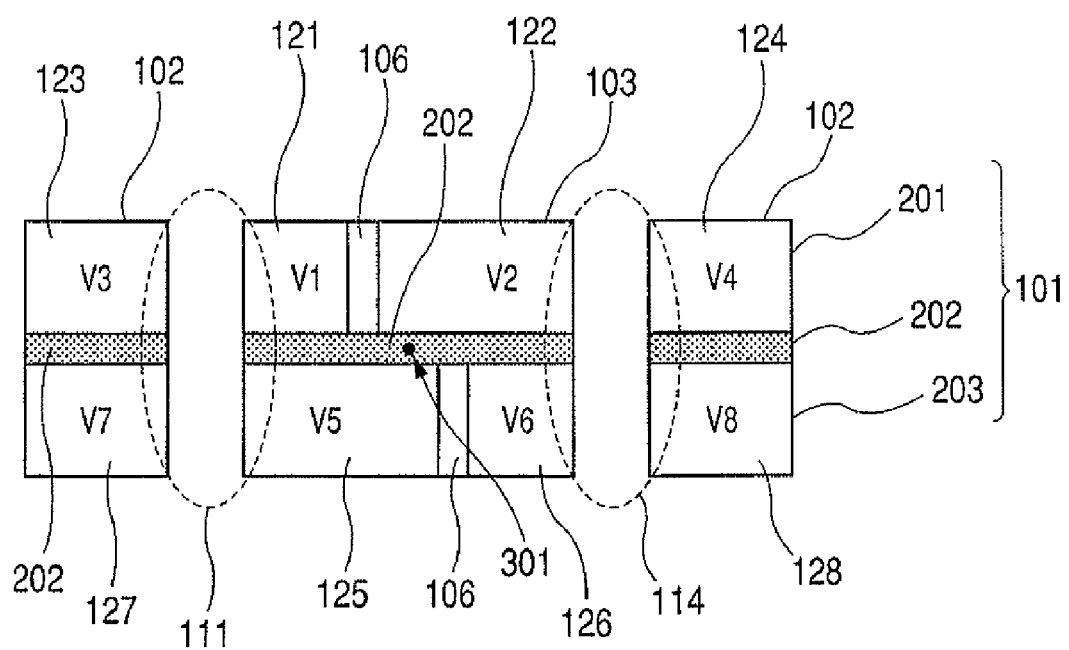
FIG. 10 is a sectional view of an actuator according to a fourth embodiment.

FIG. 10 is a sectional view of an actuator according to the present embodiment. As understood from FIG. 10, the insulating portion 106 in the first silicon layer 201 and the insulating portion 106 in the second silicon layer 203 are shifted in the side-to-side direction.

Figure 11A:
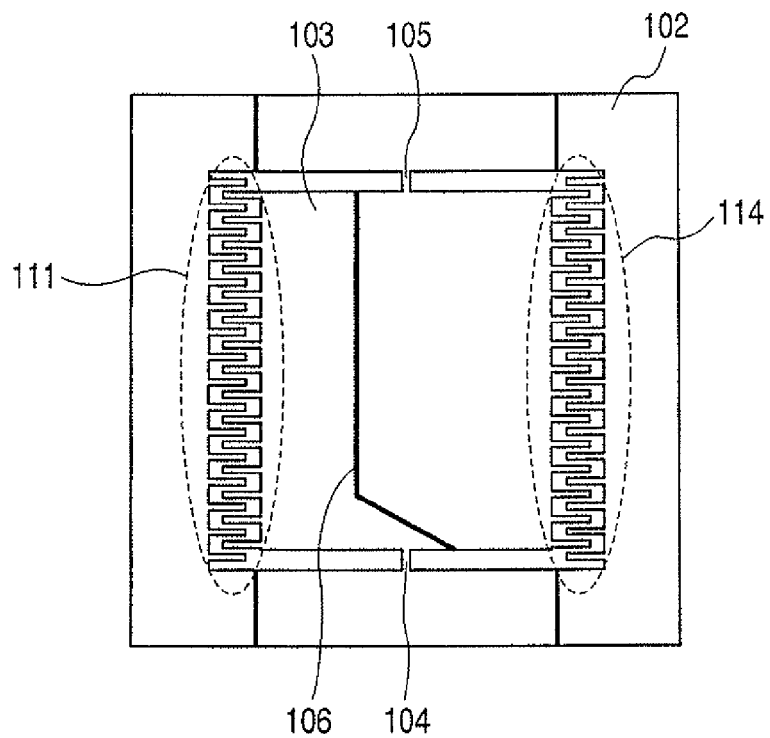
FIGS. 11A and 11B are plan views of a first silicon layer and a second silicon layer of the microstructure according to the fourth embodiment.
Figure 11B:
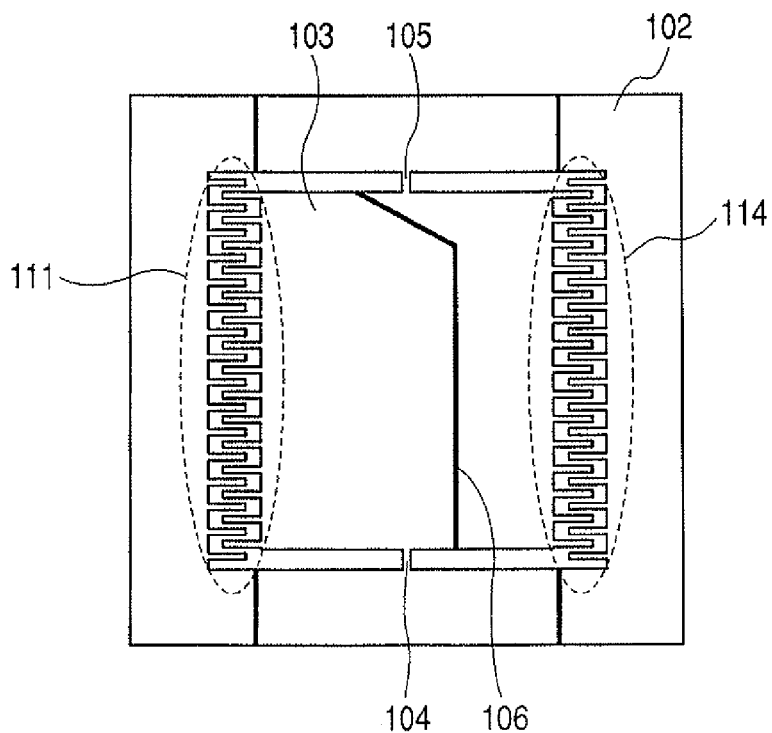

FIG. 11A is a plan view of the first silicon layer, while FIG. 11B is a plan view of the second silicon layer. In FIGS. 11A and 11B, numeral 102 denotes the support portion, 103 denotes the movable body, 104 and 105 denote the support springs, 106 denotes the insulating portion, and 111 and 114 denote the electrostatic comb elements. As understood from FIGS. 11A and 11B, the arrangement of the insulating portion 106 in the first silicon layer is different from the arrangement of the insulating portion 106 in the second silicon layer.

As described above, since the insulating portion 106 in the first silicon layer is shifted from the insulating portion 106 in the second silicon layer, the reduction in the mechanical strength due to the insulating portion can be prevented, and further, the deformation by the stress of the insulating portion can be prevented.

As described above, the present embodiment can realize a microstructure in which the reduction in the mechanical strength is small and the stress deformation is small.

Sixth Embodiment

The sixth embodiment is the same as any one of the first to fifth embodiments except for the manufacturing method.

Figure 12A:
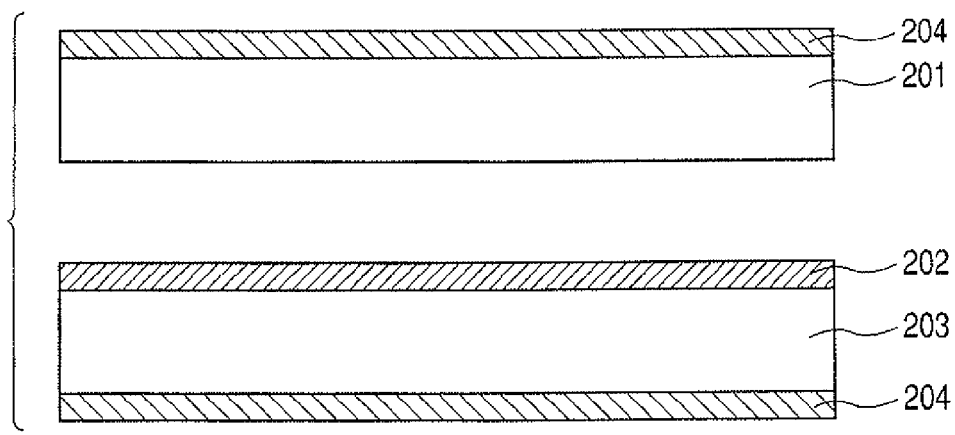
FIGS. 12AA and 12AB are views for explaining a manufacturing method of the microstructure according to the third embodiment.
Figure 12A:
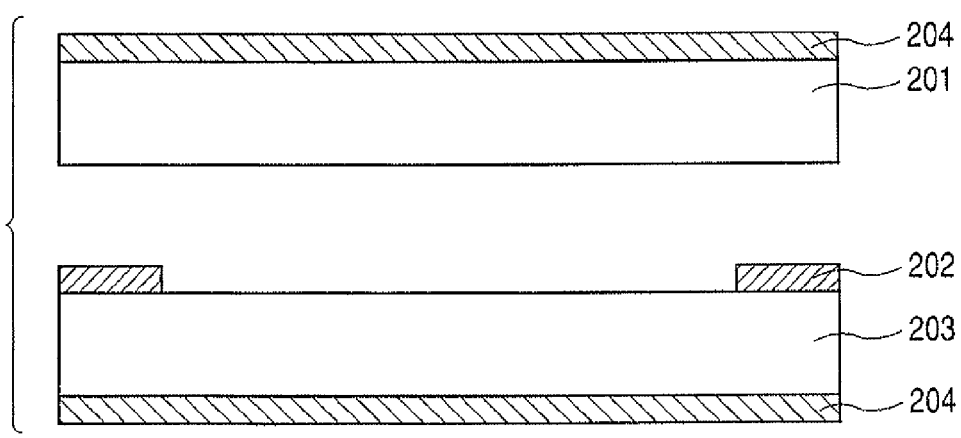

The present embodiment is characterized in that a first silicon layer 201 and a second silicon layer 203, which are separate layers, are used, and they are bonded to each other afterwards. The second mask material 204 is formed on the top surface of the first silicon layer 201. The oxidized film 202 is formed on the top surface of the second silicon layer 203, and the second mask material 204 is formed on the lower surface of the second silicon layer 203 (FIG. 12AA).

Firstly, the oxidized film 202 on the second silicon layer 203 is processed into an arbitrary shape. At this time, the oxidized film on the portion on which the through-hole is formed and its surrounding portion is removed from the silicon layer 203 (FIG. 12AB). It is to be noted that there is a method in which the oxidized film at the surrounding portion of the through-hole is not removed at this stage. FIGS. 12AA to 12D illustrate the section corresponding to the portion along a broken line P-P' in FIG. 7A.

Figure 12B:
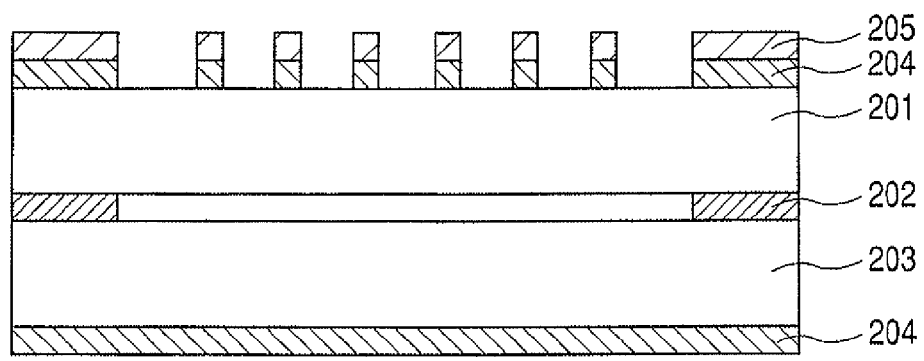
FIGS. 12BA and 12BB are views for explaining a manufacturing method of the microstructure according to the third embodiment.
Figure 12B:
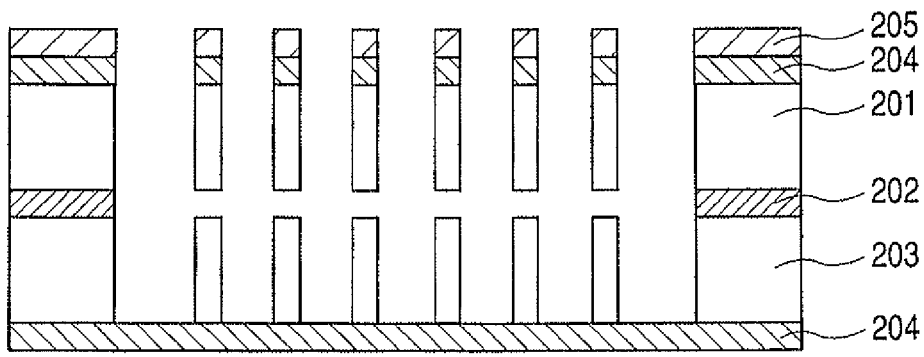

Subsequently, the first silicon layer 201 is bonded to the second silicon layer 203. Specifically, the processed oxidized film 202 on the second silicon layer 203 and the lower surface of the first silicon layer 201 are bonded (FIG. 12BA). This bonding can easily be realized by using a bonding technique used in an MEMS technique. In this case, although the oxidized film 202 on the second silicon layer 203 is processed into an arbitrary shape, the bonding is performed at the region where the oxidized film is left. Since the portion where the through-hole is formed and its surrounding portion are small regions with respect to the size of the substrate (only the portion along the broken line P-P), the mechanical strength or the like is not a problem.

After the bonding, the first mask material 205 is formed on the second mask material 204 on the first silicon layer 201. Thereafter, the first mask material 205 and the second mask material 204 are processed into an arbitrary shape (FIG. 12BA). The processing at this time can precisely be carried out with the use of photolithography or etching used in a semiconductor process.

Next, the first silicon layer 201 is anisotropically etched with the first mask material 205 used as a mask. In this case, the shape of the first silicon layer 205 is substantially transferred to the first silicon layer 203. After the first silicon layer is penetrated, the second silicon layer 203 is continuously anisotropically etched. The shape of the first mask material 205 is substantially transferred to the second silicon layer 203, since the anisotropic etching is carried out (FIG. 12BB). In the present embodiment, the oxidized film 202 is not interposed between the first silicon layer 201 and the second silicon layer 203 when forming the through-hole. Therefore, the problem that the processing precision of the anisotropic etching in the vertical direction is deteriorated due to the oxidized film having been charged hardly occurs, with the result that the through-hole with high processing precision can be formed.

Figure 12C:
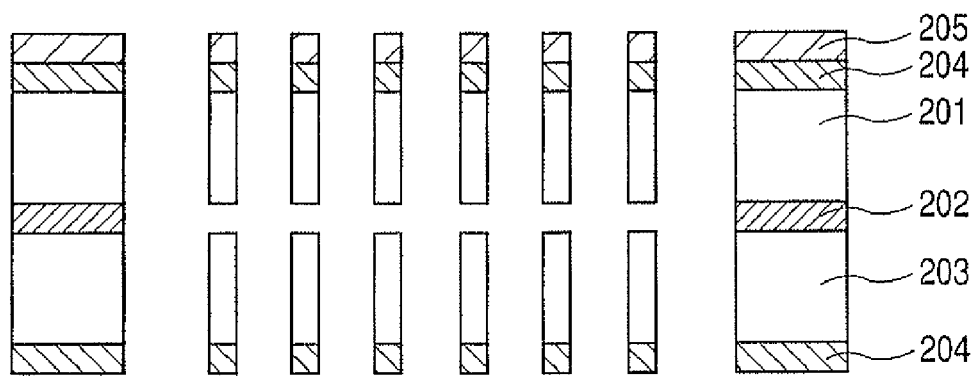
FIGS. 12CA and 12CB are views for explaining a manufacturing method of the microstructure according to the third embodiment.
Figure 12C:
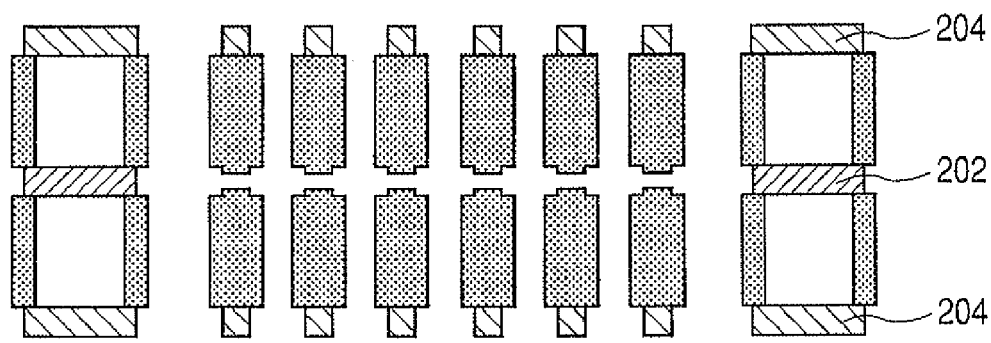

Thereafter, the second mask material 204 on the lower surface of the second silicon layer 203 is processed into the shape same as that of the first mask material 205 (FIG. 12CA).

Subsequently, after the first mask material 205 is removed, the substrate is cleaned, and the thermal oxidation is performed from the surface of the silicon (FIG. 12CB). In this case, the thermal oxidation is carried out not only from the surface of the silicon exposed to the side face of the through-hole but also from the portions of the lower surface of the first silicon layer 201 and the top surface of the second silicon layer 203 where the thermally oxidized film is not formed. In FIG. 12CB, the thermally oxidized film on the lower surface of the first silicon layer 201 and the oxidized film on the top surface of the second silicon layer 203 are not brought into contact with each other, but the present embodiment is not limited thereto. The structure in which the thermally oxidized films are not brought into contact with each other provides an effect of easily releasing the stress due to the thermally oxidized film. On the other hand, the thickness of the oxidized film 202 formed on the second silicon layer 203 and the time taken for the thermal oxidation are changed to thereby bring the oxidized films into contact with each other and form them integrally. When the thermally oxidized films are brought into contact with each other, the mechanical strength of the movable body 103 can be enhanced.

Figure 12D:
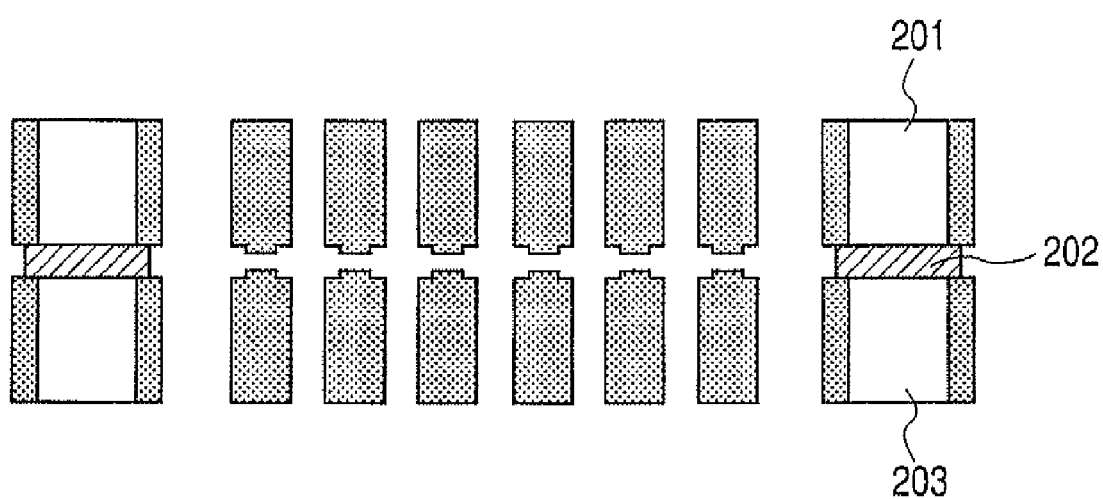
FIG. 12D is a view for explaining a manufacturing method of the microstructure according to the third embodiment.

The second mask material 204 used for the thermal oxidation may finally be removed (FIG. 12D), or may not be removed unless there are any problems on characteristics.

As described above, the present embodiment can realize a microstructure having high processing precision and excellent mechanical property with reduced number of processes.

Seventh Embodiment

The seventh embodiment is the same as any one of the first to sixth embodiments except that the microstructure is used for a gyrosensor.

Figure 13:
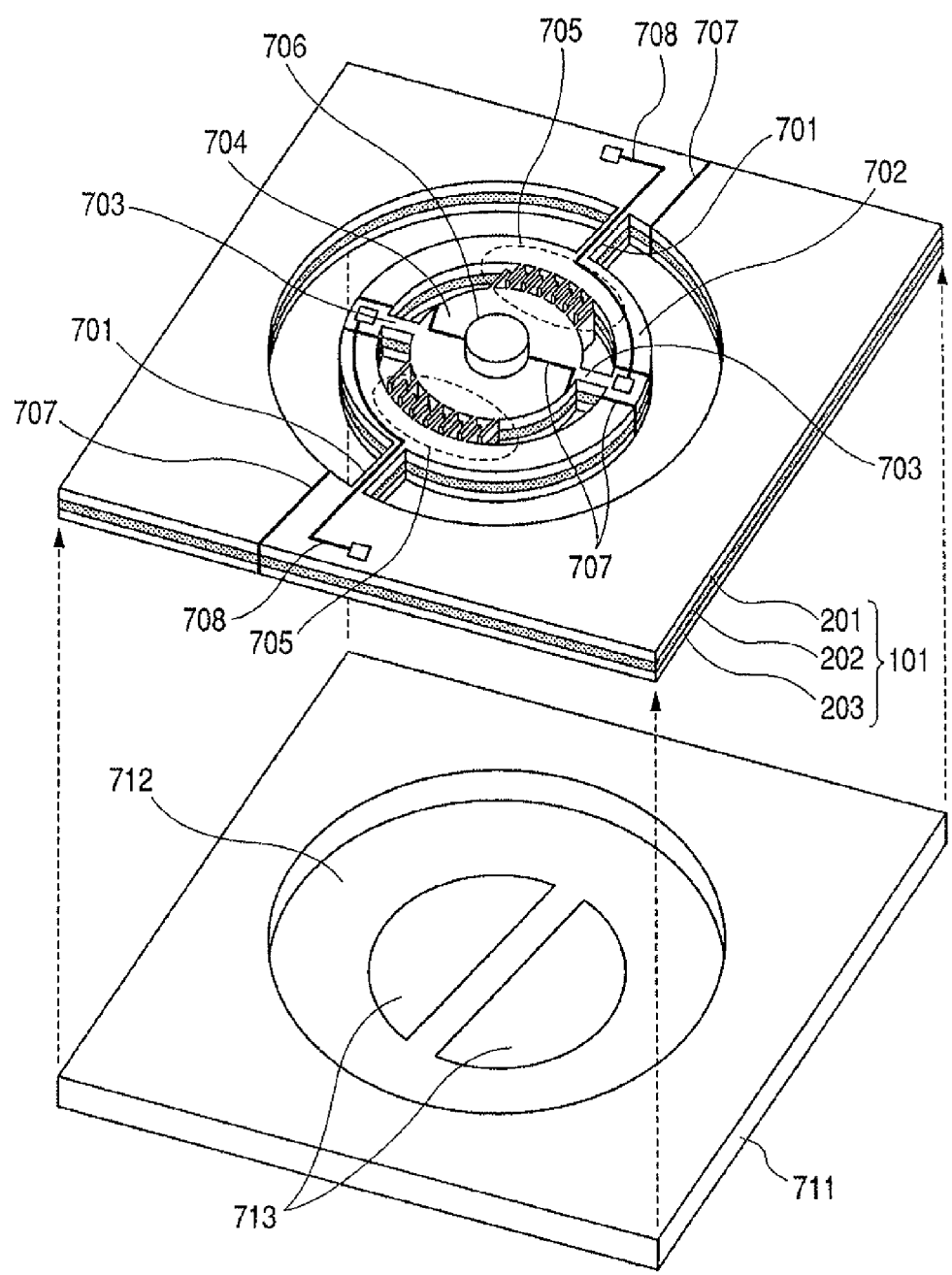
FIG. 13 is a schematic view of a gyrosensor according to a seventh embodiment.

FIG. 13 is a schematic view of a gyrosensor according to the present embodiment. In FIG. 13, numeral 701 denotes a second rotation axis, 702 denotes a second movable body, 703 denotes a first rotation axis, 704 denotes a first movable body, 705 denotes an electrostatic comb element, 706 denotes a weight, 707 denotes an insulating portion, 708 denotes a wiring, 711 denotes a support substrate, 712 denotes a depressed portion, and 713 denotes a detection electrode.

The gyrosensor according to the present embodiment employs a system in which the gyrosensor allows the first movable body 704 to perform a reference oscillation with a certain amplitude, and Coriolis force produced when an angular speed is input is detected as the displacement of the amplitude of the second movable body 702. Further, the gyrosensor has a structure in which the SOI substrate 101 and the support substrate 711 are bonded to each other. The support substrate 711 has the depressed portion 712 into which the detection electrode 713 is arranged.

The first movable body 704 having the weight 706 is supported by the second movable body 702 by the first rotation axis 703. The electrostatic comb element 705 is formed between the second movable body 702 and the first movable body 704, whereby the electrostatic force is produced such that the first movable body 703 makes a reciprocating rotational oscillation about the first rotation axis 703. This oscillation becomes the reference oscillation of the gyrosensor. This driving method is as explained in the first embodiment.

The inside of the second movable body 702 and the inside of the first movable body 704 are respectively separated into plural electrically insulated conductive regions by the insulating portion 707. The plural regions in the second movable body 702 are connected to separate potentials with the second rotation axis 701 used as a wiring. The plural regions in the first movable body 704 are electrically connected to the outside by the wiring 708 arranged on an insulating film formed on the silicon.

The present embodiment can produce a reciprocating rotational oscillation only by processing a single substrate. Therefore, the movable bodies 702 and 704 and the electrostatic comb element 705 can be integrally formed with high precision by using a semiconductor process such as photolithography. Accordingly, the electrostatic force at the electrostatic comb elements can uniformly be produced. Specifically, a stable reference oscillation can be generated by using this oscillation as the reference oscillation, whereby a stable detection of the angular speed can be carried out.

The second movable body 702 is supported by the second rotation axis 701. When the angular speed perpendicular to the plane of the figure about the axis is applied to the gyrosensor, the Coriolis force is produced in the rotating direction about the second rotation axis 701. With this, the second movable body 702 makes a reciprocating rotational oscillation with the same cycle as that of the reference oscillation about the second rotation axis 701. The magnitude of the reciprocating oscillation of the second movable body 702 is detected according to the change in the capacitance by using the electrode region (not shown) formed on the insulating film at the lower part of the first movable body 704 and the detection electrode 713.

As described above, the microstructure according to the present embodiment includes the potential application portion that applies a potential to the conductive region for allowing the movable body to make the reference oscillation about the rotation axis, and the detection portion that detects the rotation condition of the movable body about another rotation axis that is orthogonal to the rotation axis. By virtue of this structure, the present embodiment can realize a highly precise gyrosensor.

Other Embodiments

An oscillator device can be configured such that a movable body includes three electrically separated regions, i.e., one conductive region at an upper layer and two conductive regions at a lower layer. In this case, the one conductive region at the upper layer is used as a flat surface on which a mirror reflection surface is formed, and the two conductive regions at the lower layer are used as a constituent of an electrostatic driving portion together with electrodes on a support substrate opposite to the two conductive regions. Thus, an optical deflector can be composed.

The application voltage is controlled such that a potential difference is alternately produced between the electrode on one of the conductive regions at the lower layer and the electrode on the support substrate opposite to this and between the electrode on the other one of the conductive regions at the lower layer and the electrode on the support substrate opposite to this, in order to alternately exert attraction force between the electrodes. With this structure, the movable body is oscillated about the rotation axis, whereby the light incident on the mirror on the movable body can be deflected.

The oscillator device can also be configured such that one conductive region is formed across another insulating layer on the movable body shown in FIG. 1 so as to make the movable body have three electrically separated layers. In this case, one conductive region at the uppermost layer is used as a flat surface on which a mirror reflection surface is formed, and the remaining two layers function as an actuator like the one in the first embodiment, for example. By virtue of this structure, an optical deflector can be composed.

The oscillator device can also be configured such that two conductive regions are further formed on the movable body shown in FIG. 1 across insulating layers, by which the movable body is configured to have three electrically separated layers and six electrically separated conductive regions. In this case, two conductive regions on the uppermost layer are used as the detection electrode provided so as to be opposite to the subject whose potential is to be measured, and the lower two layers function as an actuator like the one in the first embodiment. This structure can realize a potential sensor that mechanically changes the capacitance between the subject to be measured and the detection electrode through the oscillation of the movable body, and detects a slight change in the charge induced to the detection electrode by electrostatic induction through a current signal. The signal from the detection electrode changes in an inverse phase. Therefore, by performing a differential process to these signals, a potential sensor having a high eliminating rate of the noise with the same phase can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-176300, filed Jul. 4, 2007, which is hereby incorporated by reference herein in its entirety.

The invention claimed is:

1. An oscillator device comprising a movable body oscillatably supported about a rotation axis by a support portion, wherein the movable body is separated into plural electrically separated conductive regions in a thickness direction of the movable body, wherein at least one of the plural electrically separated conductive regions in the thickness direction of the movable body further has plural electrically separated conductive regions that are separated in a direction perpendicular to the thickness direction by an insulating film, and wherein the plural electrically separated conductive regions in the thickness direction of the movable body and the plural electrically separated conductive regions in the direction perpendicular to the thickness direction are each electrically connected to the support portion via a support spring.

2. An oscillator device according to claim 1, wherein the movable body is electrically separated into two conductive regions in the thickness direction, each of the two conductive regions further having plural conductive regions electrically separated in the direction perpendicular to the thickness direction.

3. An oscillator device according to claim 1, wherein a part of a portion between the plural conductive regions is electrically separated by a continuous oxidized region, the oxidized region being made of an oxide in the conductive regions that is formed in a surrounding portion of plural through-holes or grooves.

4. An oscillator device according to claim 3, wherein the oxidized region is formed by thermally oxidizing a surface of the through-holes or grooves formed on a silicon layer.

5. An actuator comprising:
the oscillator device according to any one of claims 1 to 4,
a potential application portion that applies a potential to the conductive regions for oscillating the movable body about the rotation axis through conversion of input electric energy into physical motion.

6. An actuator comprising:
the oscillator device according to any one of claims 1 to 4,
a potential application portion that applies a potential to the conductive regions for oscillating the movable body about the rotation axis through conversion of input electric energy into physical motion, and
a detection portion that detects the magnitude of an induced charge induced to the conductive regions for detecting a rotation condition of the movable body about the rotation axis.

7. A sensor comprising:
the oscillator device according to any one of claims 1 to 4,
a detection portion that applies a potential to the conductive regions so as not to allow the movable body to rotate about the rotation axis by an external force and detects the external force on the basis of the applied potential.

8. A gyrosensor comprising:
the oscillator device according to any one of claims 1 to 4,
a potential application portion that applies a potential to the conductive regions for allowing the movable body to make a reference oscillation about the rotation axis through conversion of input electric energy into physical motion, and
a detection portion that detects a rotation condition of the movable body about another rotation axis that is orthogonal to the rotation axis.

* * * * *